(12) United States Patent
Pyo

(10) Patent No.: US 11,602,071 B2
(45) Date of Patent: Mar. 7, 2023

(54) DISPLAY DEVICE

(71) Applicant: LG ELECTRONICS INC., Seoul (KR)

(72) Inventor: Jonggil Pyo, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 17/444,465

(22) Filed: Aug. 4, 2021

(65) Prior Publication Data

US 2022/0338367 A1   Oct. 20, 2022

(30) Foreign Application Priority Data

Apr. 15, 2021   (KR) .................. 10-2021-0048968

(51) Int. Cl.
*H05K 7/18* (2006.01)
*G06F 1/18* (2006.01)

(52) U.S. Cl.
CPC ............. *H05K 7/183* (2013.01); *G06F 1/181* (2013.01)

(58) Field of Classification Search
CPC .................................................. G06F 1/1616
See application file for complete search history.

(56) References Cited

U.S. PATENT DOCUMENTS

| | | | |
|---|---|---|---|
| 9,081,540 B1 | 7/2015 | Cho et al. | |
| 2009/0102985 A1* | 4/2009 | Takata | G02F 1/133605 |
| | | | 362/296.07 |
| 2013/0126450 A1 | 5/2013 | Kuo et al. | |
| 2018/0271270 A1* | 9/2018 | Kincaid | H04N 5/645 |
| 2020/0319495 A1 | 10/2020 | Takuma et al. | |

FOREIGN PATENT DOCUMENTS

KR   1020200114329   10/2020

OTHER PUBLICATIONS

European Patent Office Application Serial No. 21190270.5, Search Report dated Nov. 23, 2021, 6 pages.
Korean Intellectual Property Office Application No. 10-2021-0048968, Office Action dated Mar. 31, 2022, 4 pages.

* cited by examiner

*Primary Examiner* — Jerry Wu

(74) *Attorney, Agent, or Firm* — Lee, Hong, Degerman, Kang & Waimey PC

(57) ABSTRACT

A display device includes: a module cover; a display panel which is positioned in front of the module cover, and is coupled to the module cover; a frame which surrounds a side surface of the module cover, the frame including a first frame adjacent to one side of the module cover and a second frame adjacent to the other side of the module cover opposite to the one side of the module cover; a bar which is positioned behind the module cover, extends long between the first frame and the second frame, and is coupled to the first frame and the second frame; and a mount which is positioned behind the module cover, adjacent to the one side of the module cover, and is coupled to the bar, wherein the mount is coupled to the first frame and the module cover.

11 Claims, 25 Drawing Sheets

DISPLAY DEVICE

CROSS-REFERENCE TO RELATED APPLICATION

Pursuant to 35 U.S.C. § 119 (a), this application claims the benefit of an earlier filing date and right of priority to Korean Patent Application No. 10-2021-0048968 filed on Apr. 15, 2021, the contents of which is hereby incorporated by reference herein in its entirety.

BACKGROUND OF THE INVENTION

1. Field of the Invention

The present disclosure relates to a display device.

2. Description of the Related Art

As information society develops, the demand for display device is also increasing in various forms. Accordingly, various display devices such as Liquid Crystal Display Device (LCD), Plasma Display Panel (PDP), Electro luminescent Display (ELD), Vacuum Fluorescent Display (VFD), and Organic Light Emitting Diode (OLED) have been researched and used in recent years.

Among them, an LCD panel includes a TFT substrate and a color substrate that face each other with a liquid crystal layer interposed therebetween, and may display an image using light provided from a backlight unit. In addition, the OLED panel may display an image by depositing an organic material layer capable of self-emitting light on a substrate on which a transparent electrode is formed.

Recently, a lot of researches have been achieved on a structure for covering the front surface of a display panel.

SUMMARY OF THE INVENTION

An object of the present disclosure is to solve the above and other problems.

Another object of the present disclosure is to provide a cover structure that can cover or open the front surface of the display panel.

Another object of the present disclosure is to provide a display device that is installed on a wall through a tilting bracket.

Another object of the present disclosure is to improve the rigidity of a frame forming a skeleton of a display device.

Another object of the present disclosure is to minimize deformation or damage of a frame due to tilting of the display device using a bracket or the load of the display device.

In accordance with an aspect of the present disclosure, the above and other objects can be accomplished by providing a display device, including: a module cover; a display panel which is positioned in front of the module cover, and is coupled to the module cover; a frame which surrounds a side surface of the module cover, the frame including a first frame adjacent to one side of the module cover and a second frame adjacent to the other side of the module cover opposite to the one side of the module cover; a bar which is positioned behind the module cover, extends long between the first frame and the second frame, and is coupled to the first frame and the second frame; and a mount which is positioned behind the module cover, adjacent to the one side of the module cover, and is coupled to the bar, wherein the mount is coupled to the first frame and the module cover.

BRIEF DESCRIPTION OF THE DRAWINGS

The above and other objects, features and advantages of the present invention will be more apparent from the following detailed description in conjunction with the accompanying drawings, in which.

DETAILED DESCRIPTION

Figure 1:
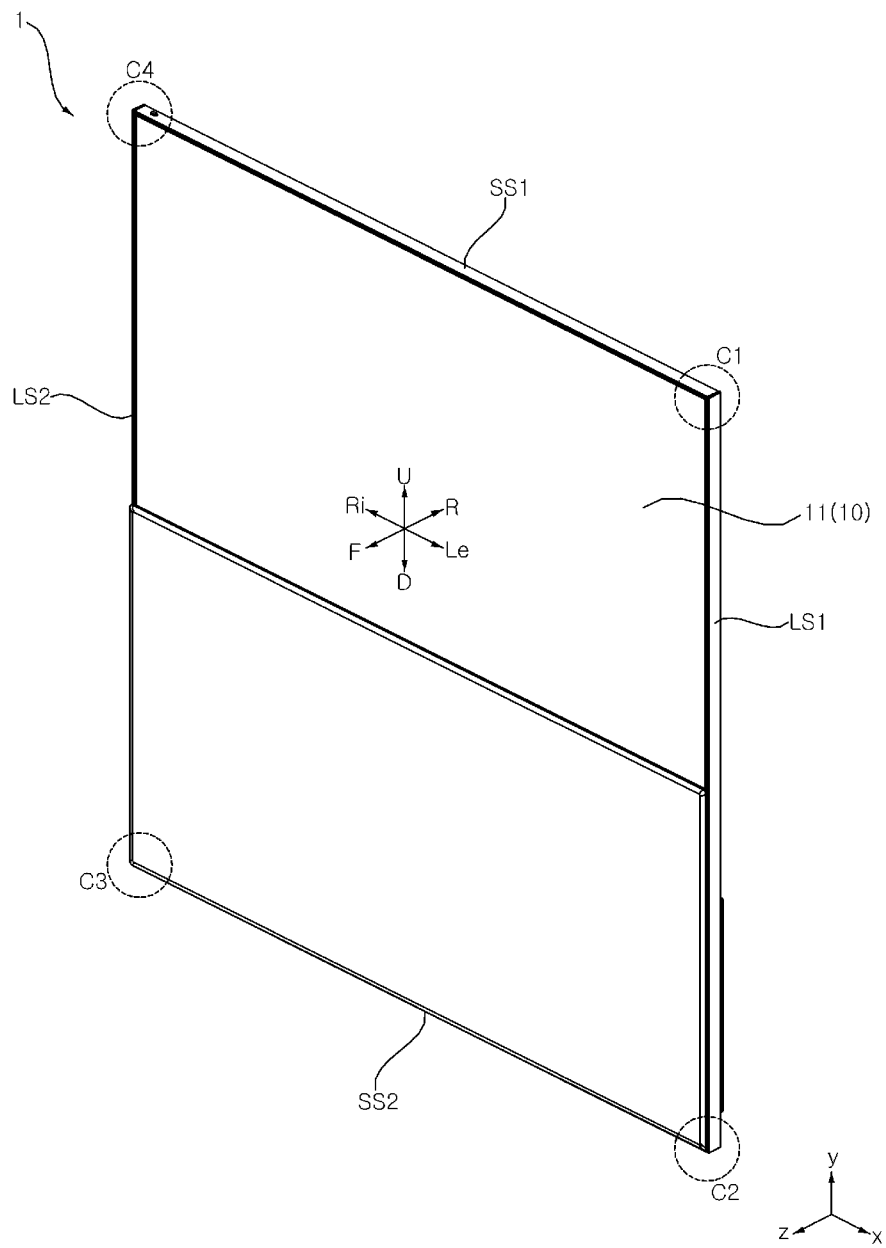
FIGS. 1 to 25 are diagrams illustrating examples of a display device according to embodiments of the present disclosure.

Hereinafter, the embodiments disclosed in the present specification will be described in detail with reference to the accompanying drawings, and the same or similar elements are denoted by the same reference numerals even though they are depicted in different drawings and redundant descriptions thereof will be omitted.

In the following description, with respect to constituent elements used in the following description, the suffixes "module" and "unit" are used or combined with each other only in consideration of ease in the preparation of the specification, and do not have or serve as different meanings.

In addition, in describing the embodiments disclosed in the present specification, if it is determined that detailed descriptions of related known technologies may obscure the gist of the embodiments disclosed in the present specification, the detailed description thereof will be omitted. In addition, the accompanying drawings are provided only for a better understanding of the embodiments disclosed in the present specification and are not intended to limit the technical ideas disclosed in the present specification. Therefore, it should be understood that the accompanying drawings include all modifications, equivalents and substitutions included in the scope and sprit of the present disclosure.

Although the terms "first," "second," etc., may be used herein to describe various components, these components should not be limited by these terms. These terms are only used to distinguish one component from another component.

These terms are only used to distinguish one component from another component. When a component is referred to as being "connected to" or "coupled to" another component, it may be directly connected to or coupled to another component or intervening components may be present. In contrast, when a component is referred to as being "directly connected to" or "directly coupled to" another component, there are no intervening components present.

As used herein, the singular form is intended to include the plural forms as well, unless the context clearly indicates otherwise.

In the following description, even if the embodiments are described with reference to specific figure, if necessary, reference numeral not appearing in the specific figure may be referred to, and the reference numeral not appearing in the specific figure is used when the above mentioned reference numeral appears in the other figures.

Figure 2:
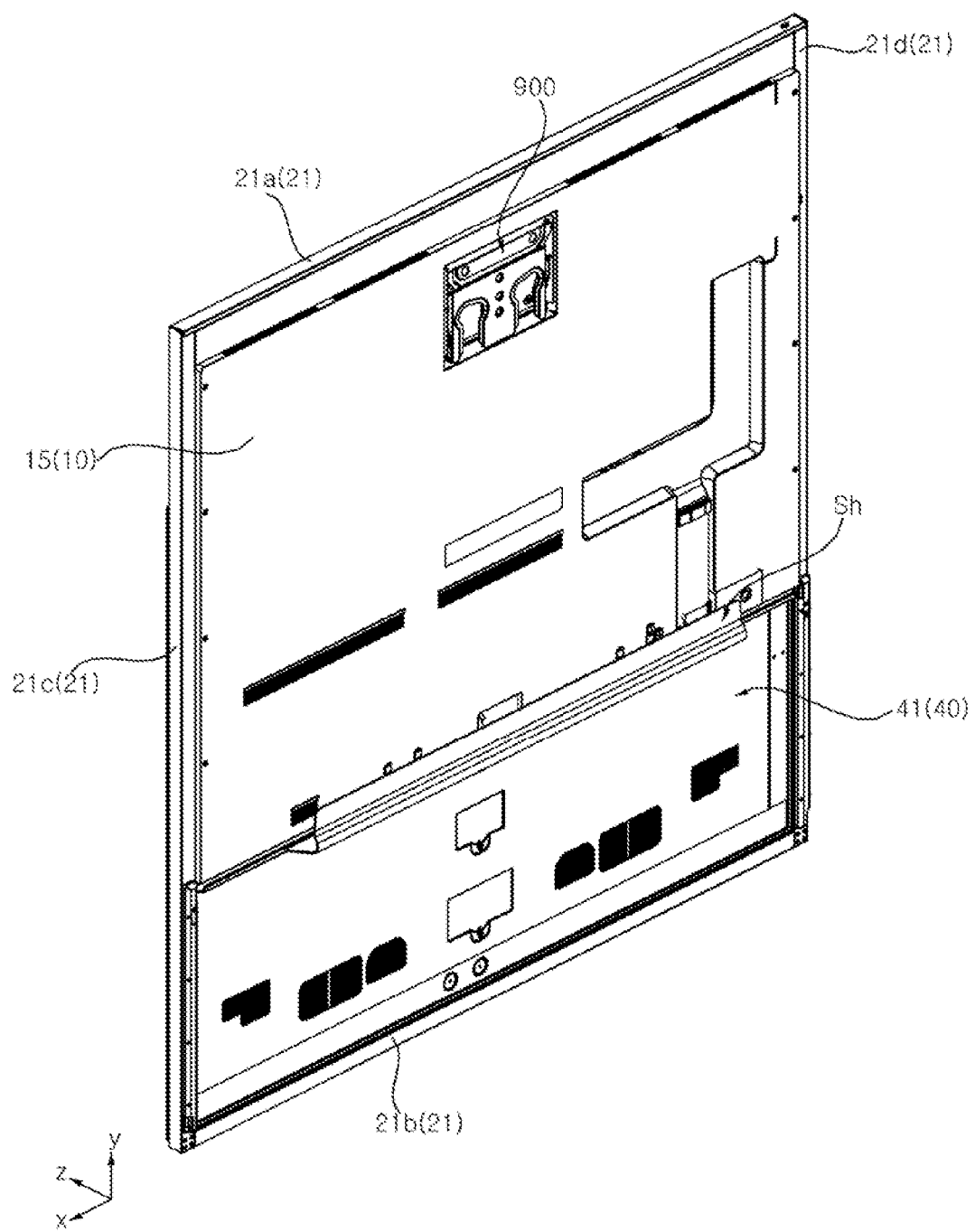

Referring to FIGS. 1 and 2, a display device 1 may include a display panel 11. The display panel 11 may display an image.

The display device 1 may include a first long side LS1, a second long side LS2 facing the first long side LS1, a first short side SS1 adjacent to the first long side LS1 and the second long side LS2, and a second short side SS2 facing the first short side SS1. Meanwhile, for convenience of explanation, it is illustrated and described that the lengths of the first and second long sides LS1 and LS2 are longer than the lengths of the first and second short sides SS1 and SS2, but it may also be possible that the lengths of the first and second long sides LS1 and LS2 are approximately equal to the lengths of the first and second short sides SS1 and SS2.

A direction parallel to the long side (LS1, LS2) of the display device 1 may be referred to as a vertical direction. A direction parallel to the short side (SS1, SS2) of the display device 1 may be referred to as a left-right direction. A direction perpendicular to the long side (LS1, LS2) and the short side (SS1, SS2) of the display device 1 may be referred to as a front-rear direction FR.

A direction in which the display panel 11 displays an image may be referred to as a front F, and a direction opposite to the front F may be referred to as a rear R. The side of the first short side SS1 may be referred to as an upper side U. The second short side SS2 side may be referred to as a lower side D. The side of the first long side LS1 may be referred to as a left side Le. The side of the second long side LS2 may be referred to as a right side Ri.

The first long side LS1, the second long side LS2, the first short side SS1, and the second short side SS2 may be referred to as an edge of the display device 1. In addition, a point where the first long side LS1, the second long side LS2, the first short side SS1, and the second short side SS2 meet each other may be referred to as a corner.

For example, a point where the first short side SS1 and the first long side LS1 meet may be referred to as a first corner C1. A point where the first long side LS1 and the second short side SS2 meet may be referred to as a second corner C2. A point where the second short side SS2 and the second long side LS2 meet may be referred to as a third corner C3. A point where the second long side LS2 and the first short side SS1 meet may be referred to as a fourth corner C4.

Figure 3:
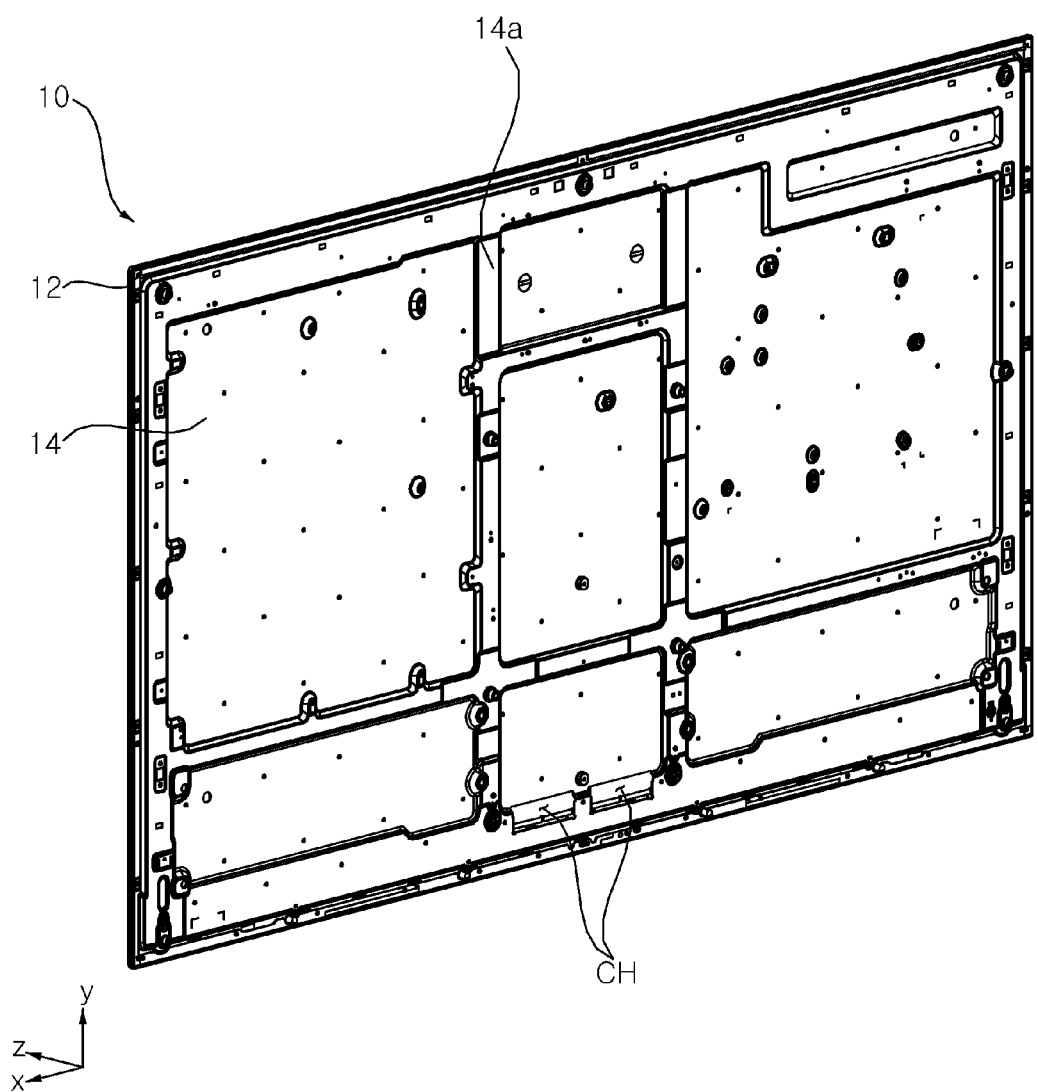
Figure 7:
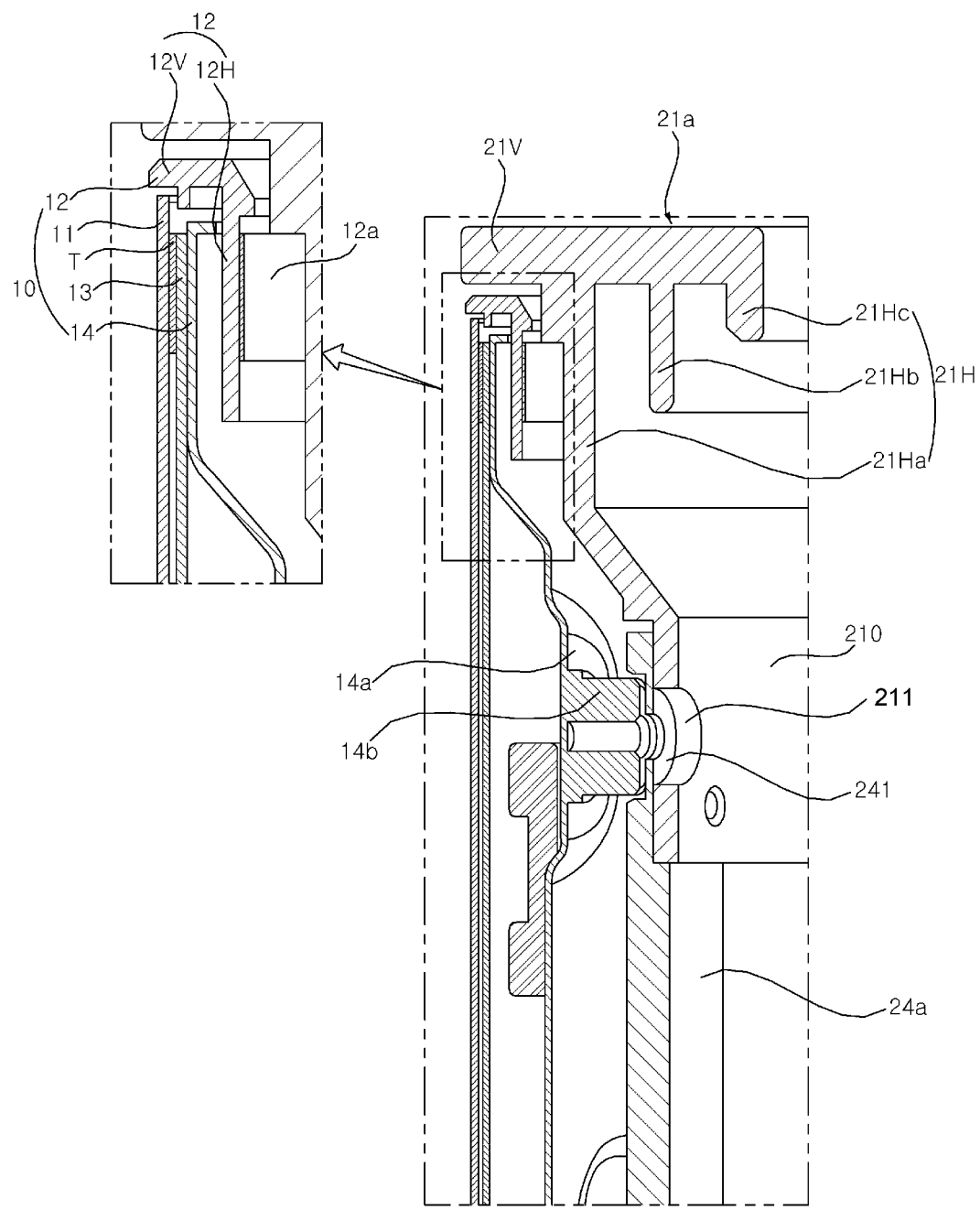

Referring to FIGS. 2, 3 and 7, a display unit 10 of the display device 1 may include a display panel 11, a middle cabinet 12, a plate 13, a module cover 14, and a back cover 15.

The display panel 11 may be an OLED panel. The display panel 11 may divide an image into a plurality of pixels and output an image by adjusting color, brightness, and saturation for each pixel. The display panel 11 may be divided into an active area in which an image is displayed and a de-active area in which an image is not displayed. The display panel 11 may generate light corresponding to a color of red, green, or blue according to a control signal. Meanwhile, the display panel 11 can be implemented with various panels such as LCD.

The middle cabinet 12 may be coupled to the display panel 11 at the rear of the display panel 11. The middle cabinet 12 may form a side surface of the display unit 10. The middle cabinet 12 may cover a side surface of the display panel 11. The middle cabinet 12 may be a square frame. For example, the middle cabinet 12 may include a metal material or a plastic material.

For example, the middle cabinet 12 may include a side part 12V and a rear part 12H. The side part 12V may form a side surface of the middle cabinet 12. A part of the side part 12V may cover a side surface of the display panel 11. The rear part 12H may be provided inside the side part 12V. The rear part 12H may cover a part of the rear direction of the display panel 11. Meanwhile, a gap pad 12a may be provided on the rear surface of the rear part 12H to face an outer frame 21.

A plate 13 may be coupled to the display panel 11 at the rear of the display panel 11. In this case, an adhesive member T may be coupled to the display panel 11 and the plate 13 between the display panel 11 and the plate 13. For example, the adhesive member T may be a double-sided tape.

A module cover 14 may be coupled to or fixed to the plate 13 at the rear of the plate 13. That is, the module cover 14 may cover the rear of the plate 13. The module cover 14 and the plate 13 may be disposed between the display panel 11 and the rear part 12H. A printed circuit board (PCB) or electronic component may be installed in the rear surface of the module cover 14. For example, the module cover 14 may include a metal material. A rigid part 14a may be formed while being pressed from the front to the rear of the module cover 14. Accordingly, the rigid part 14a may improve the torsional rigidity and/or the bending rigidity of the module cover 14. Meanwhile, the module cover 14 may be referred to as a main frame or an inner frame.

The back cover 15 may cover the rear of the module cover 14. The back cover 15 may form a part of the rear surface of the display device 1. For example, the back cover 15 may include a metal material or a plastic material.

Figure 4:
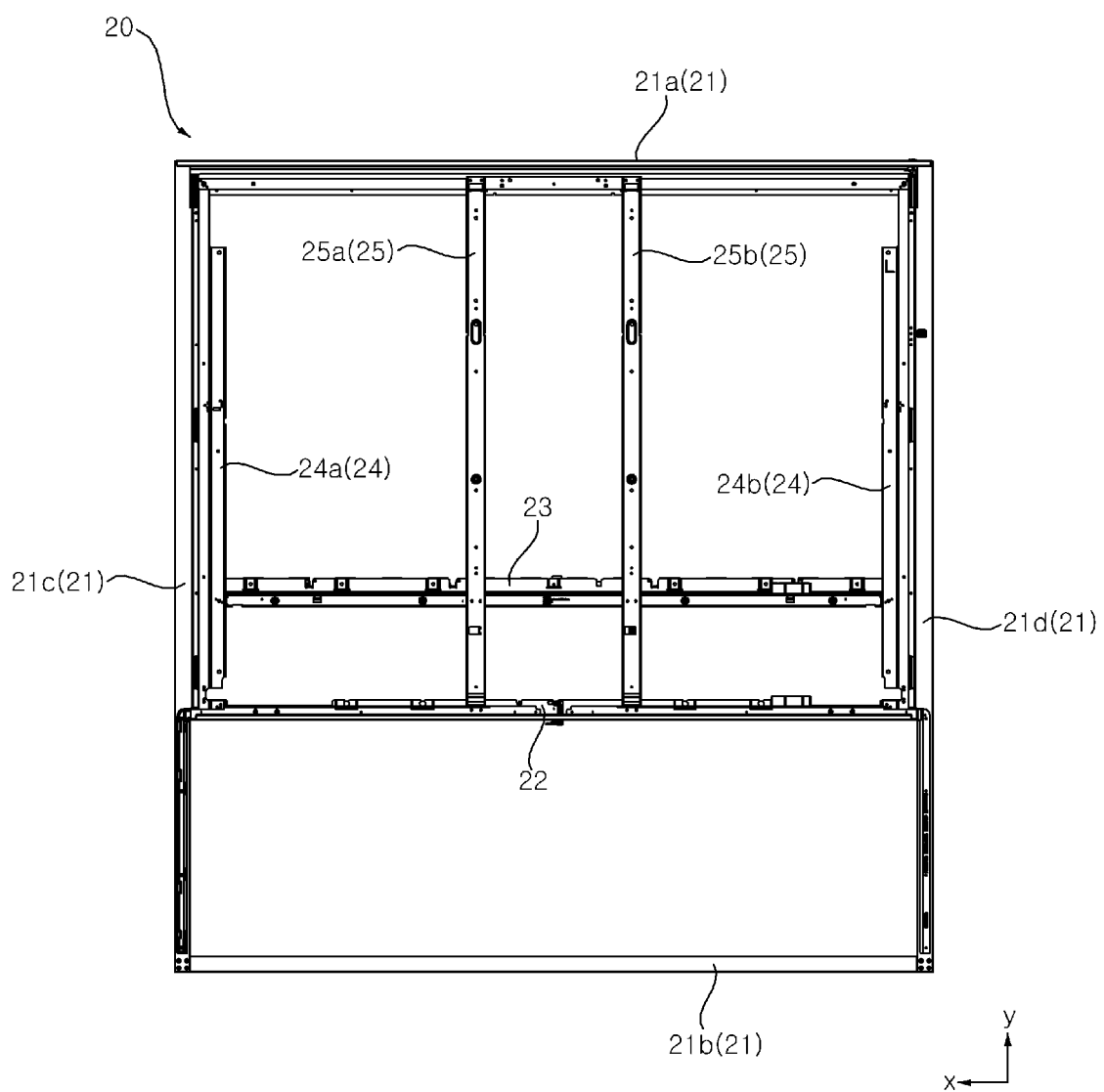

Referring to FIG. 4, a frame 20 may form a skeleton of the display device 1. The frame 20 may include an outer frame 21, a lower frame 22, an upper frame 23, and a guide frame 24.

The outer frame 21 may form a circumference of the frame 20 and may be a rectangular frame as a whole. The first outer frame 21a may form an upper side of the outer frame 21 and may extend long in the left and right direction. The second outer frame 21b may form a lower side of the outer frame 21 and may extend long in the left and right direction. The third outer frame 21c may form a left side of the outer frame 21 and may extend long in the vertical direction. The fourth outer frame 21d may form a right side of the outer frame 21 and may extend long vertically. Meanwhile, the first outer frame 21a may be referred to as a top frame or a first frame 21a. In addition, the second outer frame 21b may be referred to as a bottom frame.

In addition, the first corner C1 (refer to FIG. 1) may be formed at a point where the first outer frame 21a and the third outer frame 21c meet. The second corner C2 (refer to FIG. 1) may be formed at a point where the third outer frame 21c and the second outer frame 21b meet. The third corner C3 (refer to FIG. 1) may be formed at a point where the second outer frame 21b and the fourth outer frame 21d meet. The fourth corner C4 (refer to FIG. 1) may be formed at a point where the fourth outer frame 21d and the first outer frame 21a meet.

The lower frame 22 may extend long in the left and right direction between the third outer frame 21c and the fourth outer frame 21d, and may be coupled to or fixed to the third outer frame 21c and the fourth outer frame 21d. The lower frame 22 may be disposed closer to the second outer frame 21b than the first outer frame 21a. Meanwhile, the lower frame 22 may be referred to as a second frame 22.

The upper frame 23 may be located in the upper side of the lower frame 22. The upper frame 23 may be located in the front of the guide frame 24 and the middle frame 24 described later. For example, the upper frame 23 may extend long in the left and right direction between the third outer frame 21c and the fourth outer frame 21d, and may be coupled to or fixed to the third outer frame 21c and the fourth outer frame 21d. For another example, the upper frame 23 may extend long in the left and right direction between the first guide frame 24a and the second guide frame 24b described later, and may be coupled to or fixed to the first guide frame 24a and the second guide frame 24b. Meanwhile, the upper frame 23 may be referred to as a center frame.

The guide frame 24 may extend long in the vertical direction between the first outer frame 21a and the lower frame 22. The first guide frame 24a may be coupled or fixed to the third outer frame 21c at the right side of the third outer frame 21c, and the upper end of the first guide frame 24a may be coupled to or fixed to the first outer frame 21a. Furthermore, the lower end of the first guide frame 24a may be coupled to or fixed to the lower frame 22. The second guide frame 24b may be coupled to or fixed to the fourth outer frame 21d at the left side of the fourth outer frame 21d, and the upper end of the second guide frame 24b may be coupled to or fixed to the first outer frame 21a. Furthermore, the lower end of the second guide frame 24b may be coupled to or fixed to the lower frame 22.

Meanwhile, a bar 25 may extend long in the vertical direction between the first outer frame 21a and the lower frame 22, and may coupled to or fixed to the first outer frame 21a and the lower frame 22. For example, the bar 25 may include a first bar 25a and a second bar 25b that are spaced apart from each other in the left and right direction. For example, a single bar 25 may be provided and disposed in the center of the frame 20, or three or more bars may be provided and spaced apart from each other in the left and right direction. Meanwhile, the bar 25 may be referred to as a vertical bar or a middle frame.

Figure 5:
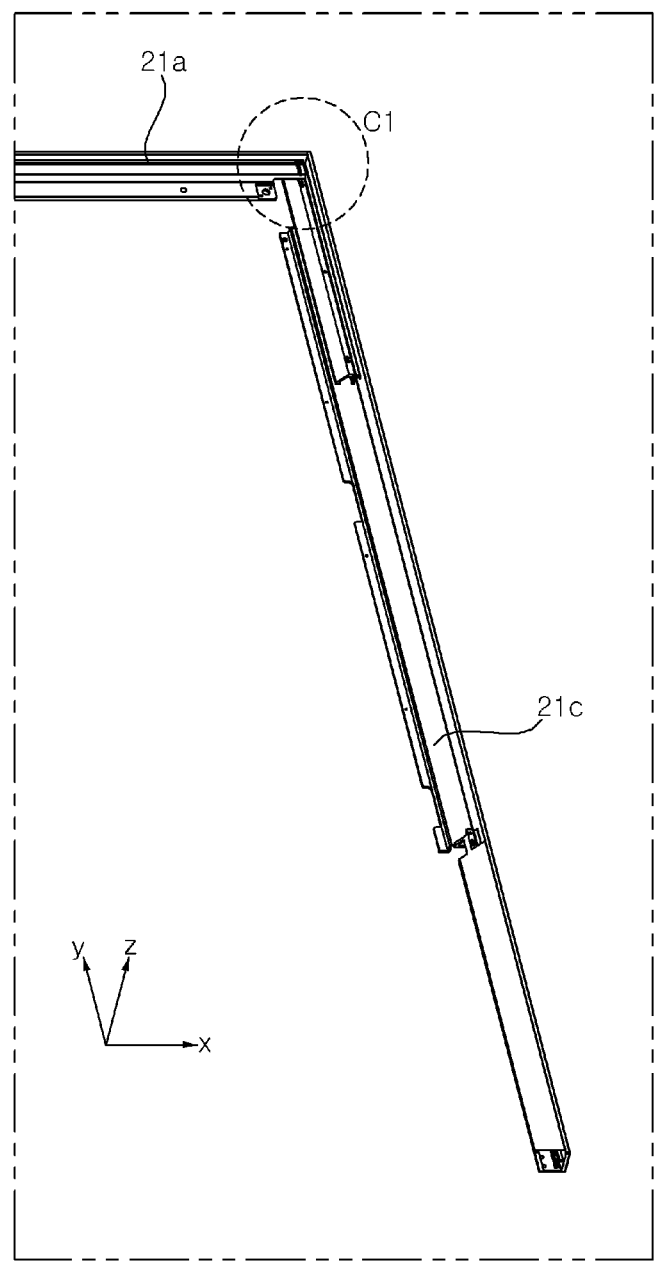
Figure 6:
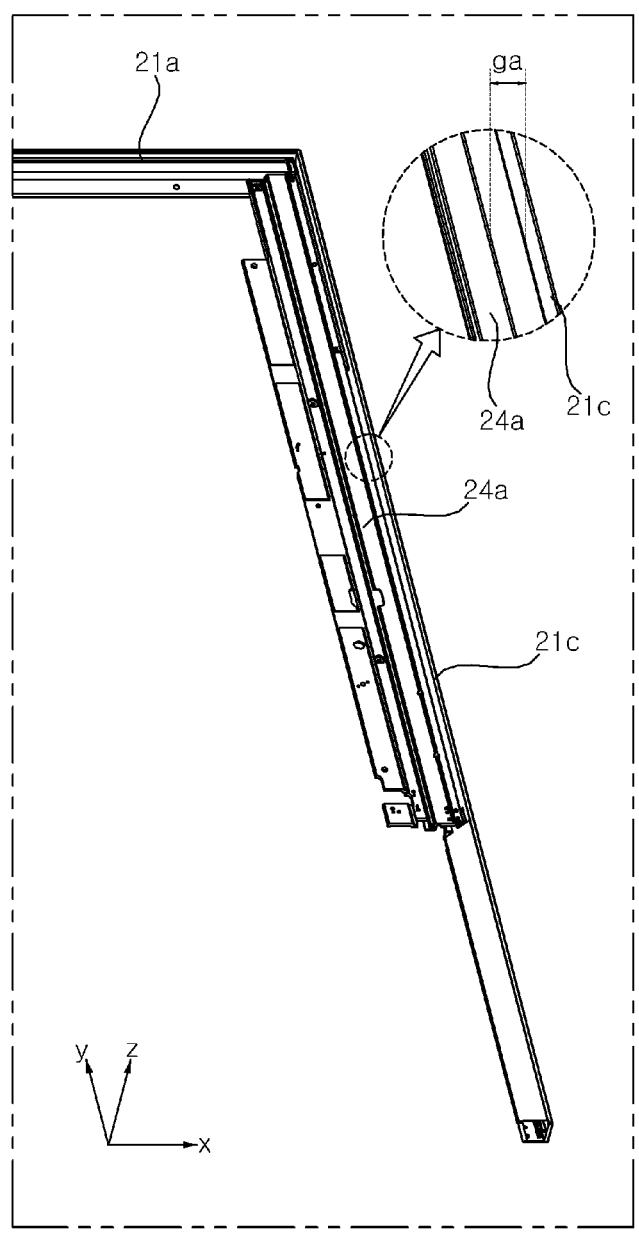

Referring to FIGS. 5 and 6, the third outer frame 21c may be coupled to the left end of the first outer frame 21a in the lower side of the first outer frame 21a. For example, a fastening member such as a screw may be fastened to the third outer frame 21c and the first outer frame 21a.

The first guide frame 24a may be coupled to the third outer frame 21c in the front of the third outer frame 21c. For example, a fastening member such as a screw may be fastened to the first guide frame 24a and the third outer frame 21c. In addition, the first guide frame 24a may cover a part of the front surface of the third outer frame 21c. In this case, a first gap ga may be formed between the first guide frame 24a and the third outer frame 21c.

The fourth outer frame 21d (refer to FIG. 4) and the third outer frame 21c may be symmetrical left and right. The second guide frame 24b (refer to FIG. 4) and the first guide frame 24a may be symmetrical left and right.

Referring to FIG. 7, the first outer frame 21a may include a vertical portion 21V and a horizontal portion 21H. The vertical portion 21V and the horizontal portion 21H may extend long in the left and right direction along the edge of the first outer frame 21a.

The vertical portion 21V may form an upper surface of the first outer frame 21a. The vertical portion 21V may have a width in a direction intersecting with the display unit 10. In other words, the length of the vertical portion 21V may be defined in the left-right direction, the width of the vertical portion 21V may be defined in the front-rear direction, and the thickness of the vertical portion 21V may be defined in the vertical direction. A part of the vertical portion 21V may cover a side surface of the display unit 10.

The horizontal portion 21H may be provided in the lower side of the vertical portion 21V. The horizontal portion 21H may be disposed in parallel to the display unit 10 at the rear of the display unit 10. In other words, the length of the horizontal portion 21H may be defined in the left-right direction, the width of the horizontal portion 21H may be defined in the vertical direction, and the thickness of the horizontal portion 2H may be defined in the front-rear direction. The horizontal portion 21H may cover a part of the rear of the display unit 10.

For example, the horizontal portion 21H may include a first horizontal portion 21Ha, a second horizontal portion 21Hb, and a third horizontal portion 21Hc spaced apart from each other in the front-rear direction. In this case, the width of the first horizontal portion 21Ha may be larger than the width of the second horizontal portion 21Hb, and the width of the third horizontal portion 21Hc may be smaller than the width of the second horizontal portion 21Hb. In addition, the first horizontal portion 21Ha may be bent at least twice.

A coupling part 210 may form a part of the first horizontal portion 21Ha and may form a rearmost surface of the first horizontal portion 21Ha. The first guide frame 24a may contact the inside of the coupling part 210. A first fixing part 14b may protrude from the rigid part 14a toward the first guide frame 24a, i.e., to the rear.

The first fixing part 14b, the first guide frame 24a, and the coupling part 210 may be coupled to each other through a fastening member. For example, a first guide hole 241 may be formed through the first guide frame 24a, and a first coupling hole 211 may be formed through the coupling part 210. In this case, the first guide hole 241 and the first coupling hole 211 may be arranged in the first fixing part 14b, and the first fixing part 14b may be a pemnut fastened with a screw. Meanwhile, the coupling structure of the module cover 14 for the first outer frame 21a and the first guide frame 24a may be identically applied to the coupling structure of the module cover 14 for the first outer frame 21a and the second guide frame 24b (refer to FIG. 4).

Accordingly, the display unit 10 may be coupled to the first outer frame 21a through the fixing part provided in the rigid part 14a, thereby improving torsional rigidity and/or bending rigidity of the display device.

Figure 8:
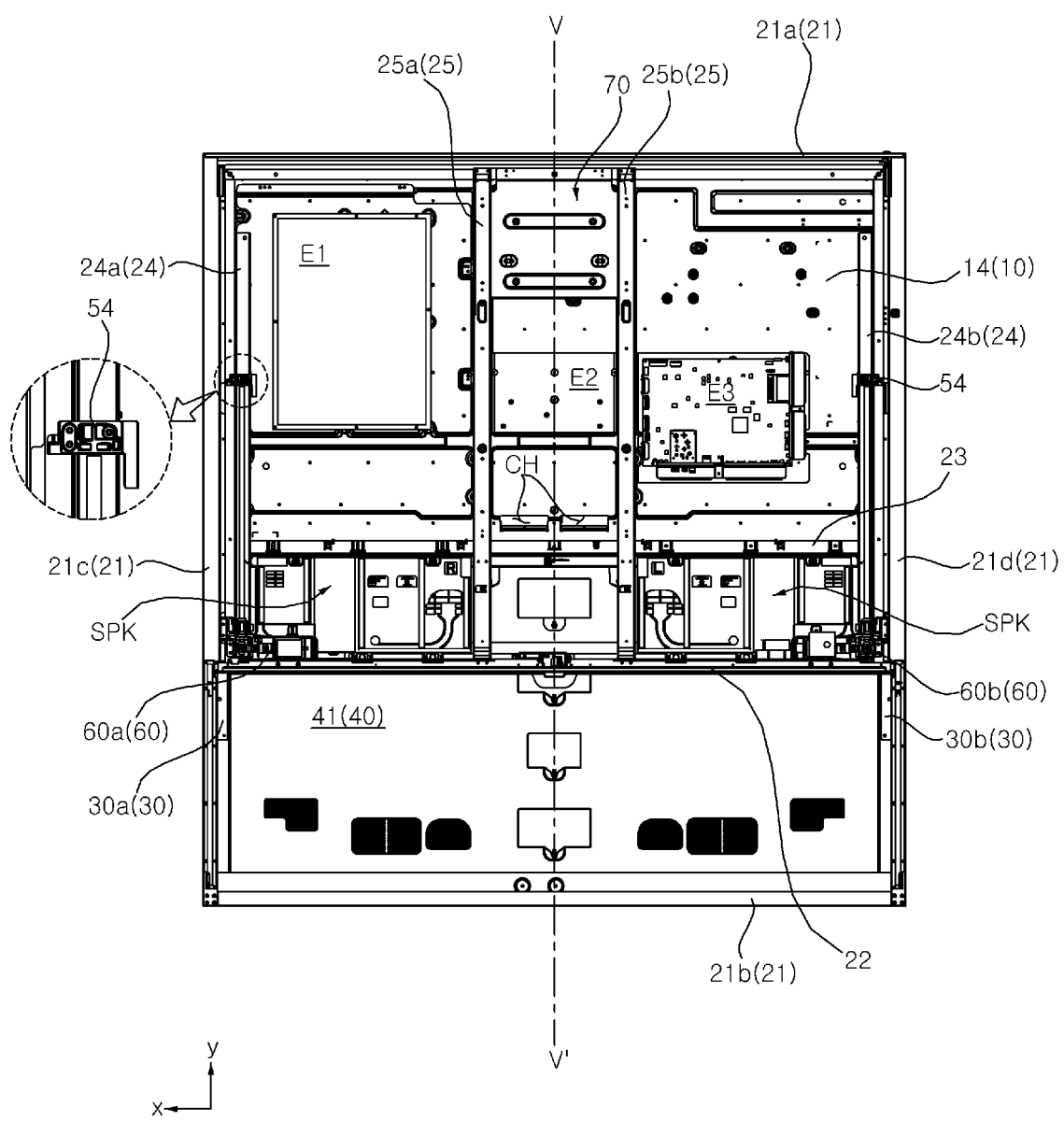

Referring to FIG. 8, the module cover 14 may be disposed between the third outer frame 21c and the fourth outer frame 21d. The module cover 14 may be located in the front of the bar 25. The upper end of the module cover 14 may be coupled to the first outer frame 21a, and the lower end of the module cover 14 may be coupled to the upper frame 23.

Electronic components may be mounted on the rear surface of the module cover 14. A first board E1, a second board E2, and a third board E3 may be electrically connected to each other while being spaced apart from each other, and may be mounted on the rear surface of the module cover 14.

The first board E1 may be a power supply board that supplies power to each component of the display device 1. The second board E2 may be a timing controller board that provides an image signal to the display panel 11 (refer to FIG. 7). In this case, a cable hole CH may be formed to penetrate the module cover 14 while being adjacent to the lower end of the module cover 14, and a cable (not shown) may be connected to the second board E2 and the display panel 11 through the cable hole CH. The third board E3 may be a main board that controls each component of the display device 1.

A speaker SPK may be fixed on the lower frame 22 between the upper frame 23 and the lower frame 22, and may provide sound to the front of the display device 1. For example, a left speaker may be disposed between the third outer frame 21c and the first bar 25a, and a right speaker may be disposed between the fourth outer frame 21d and the second bar 25b.

Figure 9:
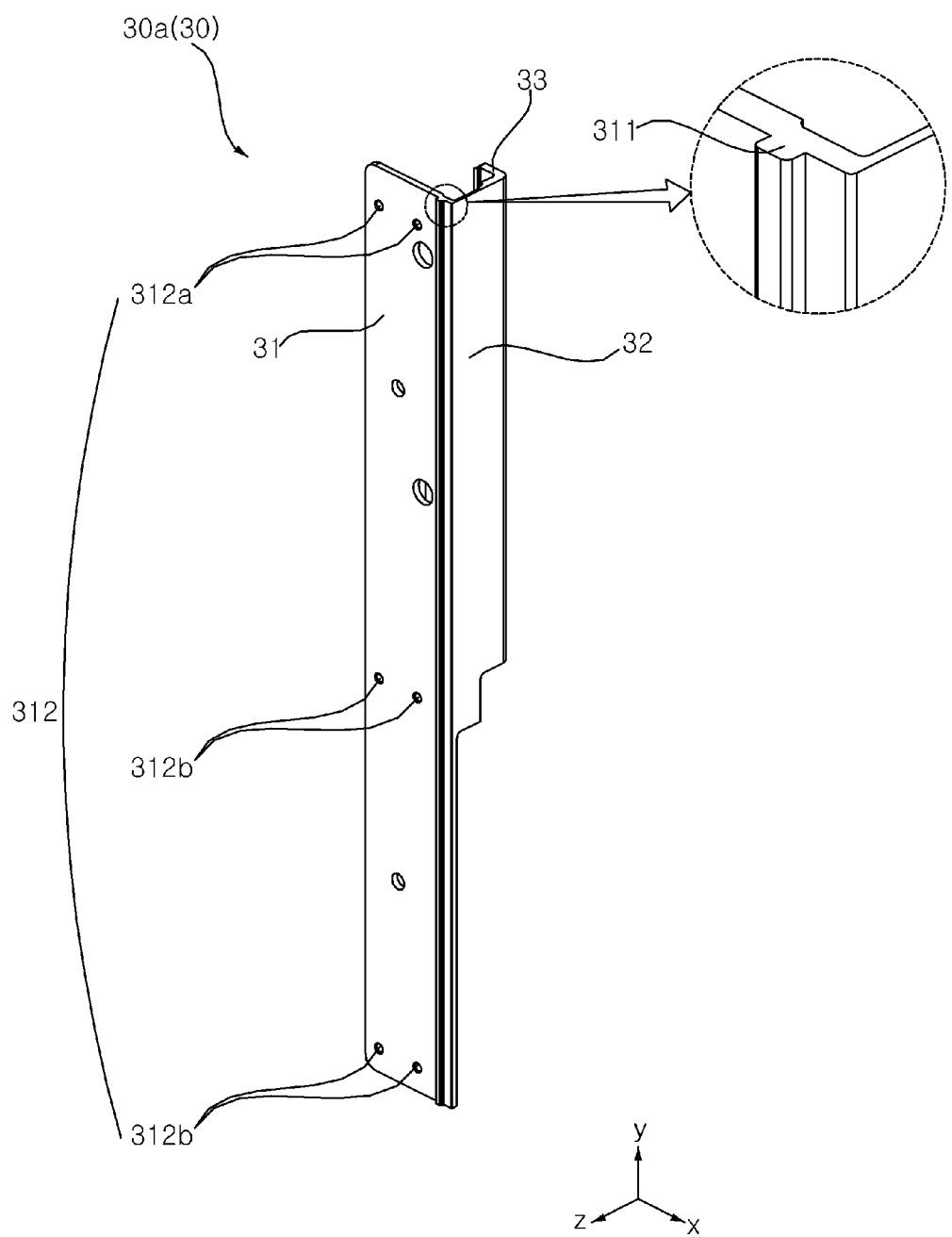

Referring to FIGS. 8 and 9, a supporter 30 may extend long in the vertical direction. The supporter 30 may include a first part 31, a second part 32, and a third part 33.

The first part 31 may form the front surface of the supporter 30 and define the entire length of the supporter 30. The second part 32 may be bent to the rear from the first part 31 to form a side surface of the supporter 30. The second part 32 may be disposed closer to the upper end of the first part 31 than the lower end. For example, the upper end of the second part 32 may be connected to the upper end of the first part 31, and the length of the second part 32 may be about half the length of the first part 31. The third part 33 may be bent to the right side or left side from the second part 32 to face the first part 31. In this case, the third part 33 may be spaced to the rear from the first part 31. For example, the first part 31, the second part 32, and the third part 33 may be provided as one body. For another example, the first part 31, the second part 32, and the third part 33 may be separately provided and may be coupled to each other through screw coupling or welding.

The supporter hole 312 may be formed to penetrate the first part 31 in the front-rear direction. For example, the supporter hole 312 may be provided with a pair of holes spaced apart from each other in the left and right direction. For example, the supporter hole 312 may include supporter holes 312a, 312b, and 312c spaced apart from each other in the length direction of the first part 31. The first supporter hole 312a may be adjacent to the upper end of the first part 31, the third supporter hole 312c may be adjacent to the lower end of the first part 31, and the second supporter hole 312b may be disposed between the first supporter hole 312a and the third supporter hole 312c.

The supporter 30 may include a first supporter 30a and a second supporter 30b that are spaced apart from each other in the left and right direction. The first supporter 30a may be adjacent to the third outer frame 21c, and the second supporter 30b may be adjacent to the fourth outer frame 21d. The second part 32 of the first supporter 30a may be provided in the left end of the first part 31, and the third part 33 of the first supporter 30a may be bent to the right side from the second part 32. The second part 32 of the second supporter 30b may be provided in the right end of the first part 31, and the third part 33 of the second supporter 30b may be bent to the left side from the second part 32.

For example, the first supporter 30a and the second supporter 30b may be symmetrical left and right with respect to a reference line VV' extending vertically while passing through the center of the display device.

Figure 10:
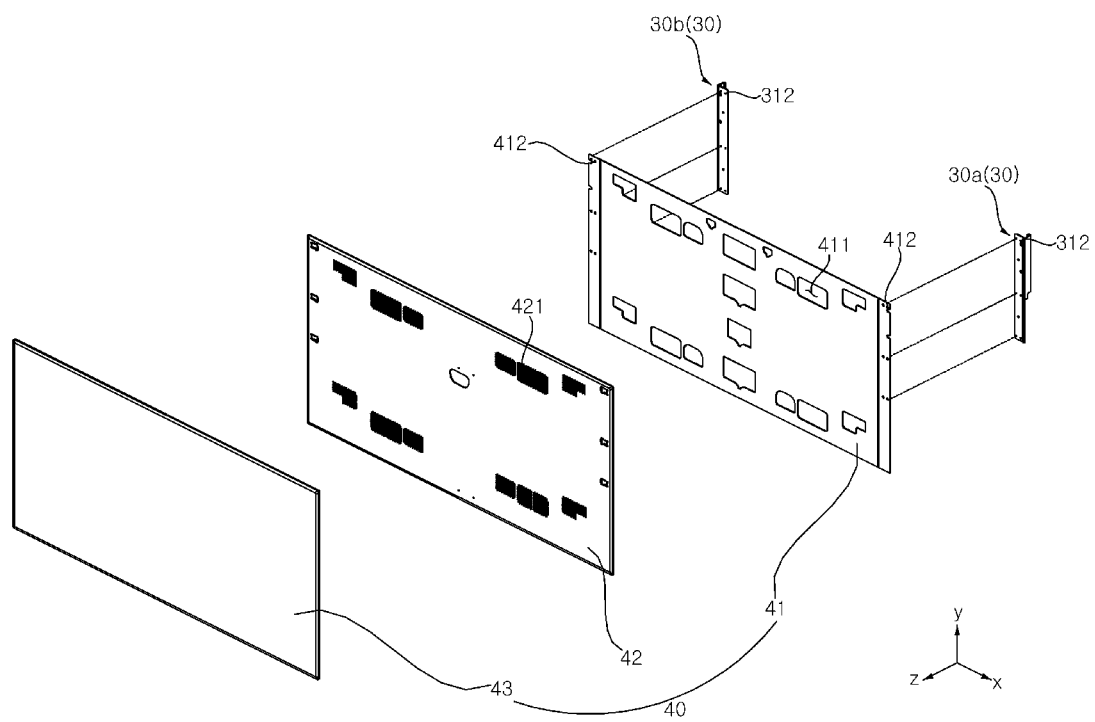

Referring to FIGS. 8 and 10, the supporter 30 may be detachably coupled to a cover assembly 40 at the rear of the cover assembly 40. The cover assembly 40 may include a cover base 41, a cover body 42, and a cover 43.

The cover base 41 may be a rectangular plate as a whole. A base hole 411 may be formed to penetrate the cover base 41 in the front-rear direction, and may face the speaker SPK. The first supporter 30a may be adjacent to the left side of the cover base 41, and the first part 311 of the first supporter 30a may contact the rear surface of the cover base 41. In this case, a fastening member (not shown) such as a screw may penetrate the hole 412 of the cover base 41 from the front of the cover base 41 and be fastened to the supporter hole 312 of the first supporter 30a. The second supporter 30b may be adjacent to the right side of the cover base 41, and the first part 311 of the second supporter 30b may contact the rear surface of the cover base 41. In this case, a fastening member (not shown) such as a screw may penetrate the hole 412 of the cover base 41 from the front of the cover base 41 and be fastened to the supporter hole 312 of the second supporter 30b. Meanwhile, the cover base 41 may be disposed in the front of the display unit 10 (refer to FIG. 7).

The cover body 42 may be detachably coupled to the cover base 41 at the front of the cover base 41. The body hole 421 may be formed to penetrate the cover body 42 in the front-rear direction, and may face the base hole 411. For example, the body hole 421 may be provided with pores having a small size.

The cover 43 may be detachably coupled to the cover body 42 at the front of the cover body 42. For example, the cover 43 may include a fabric material. Meanwhile, the cover 43 may be referred to as a jersey.

Figure 11:
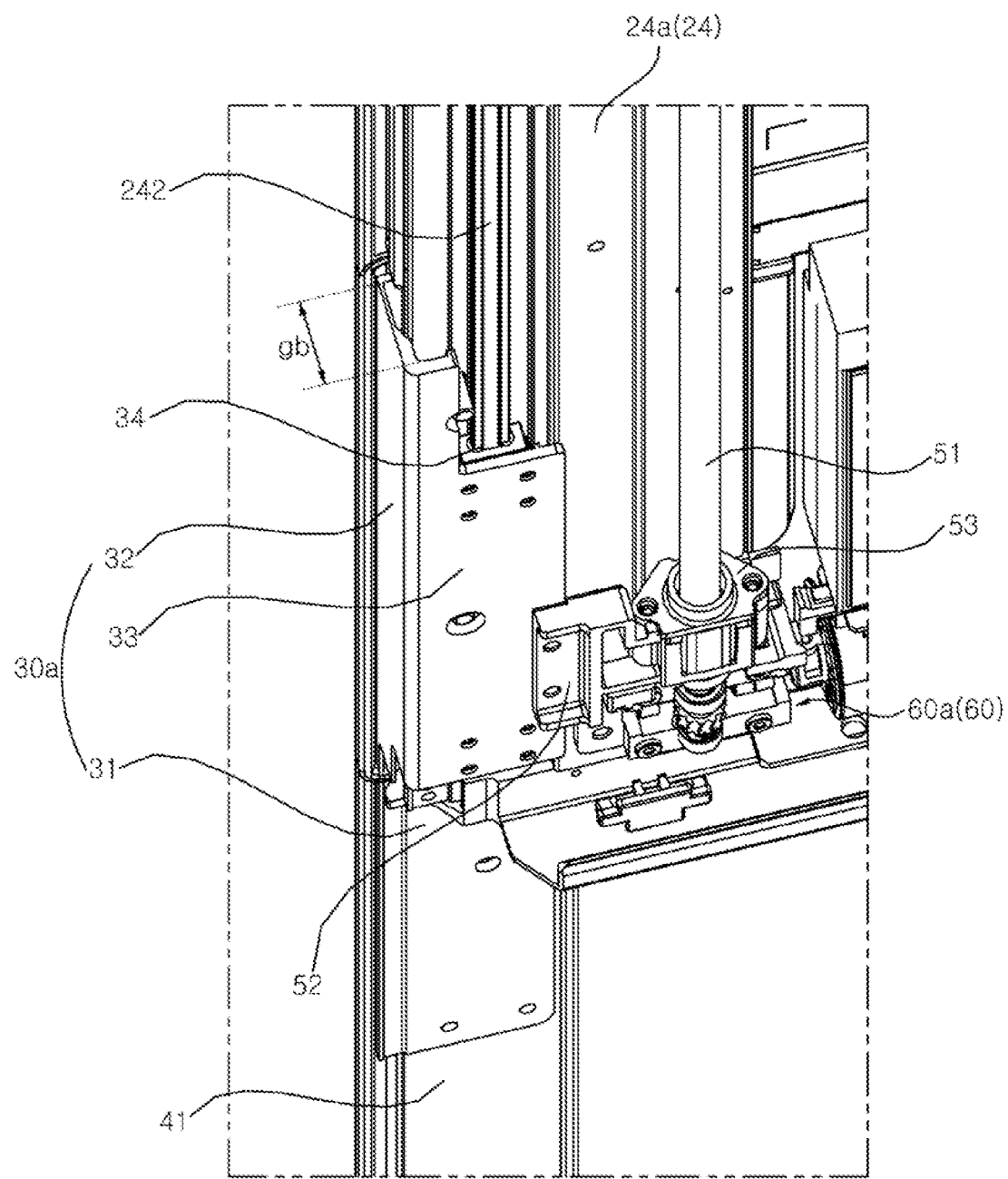
Figure 12:
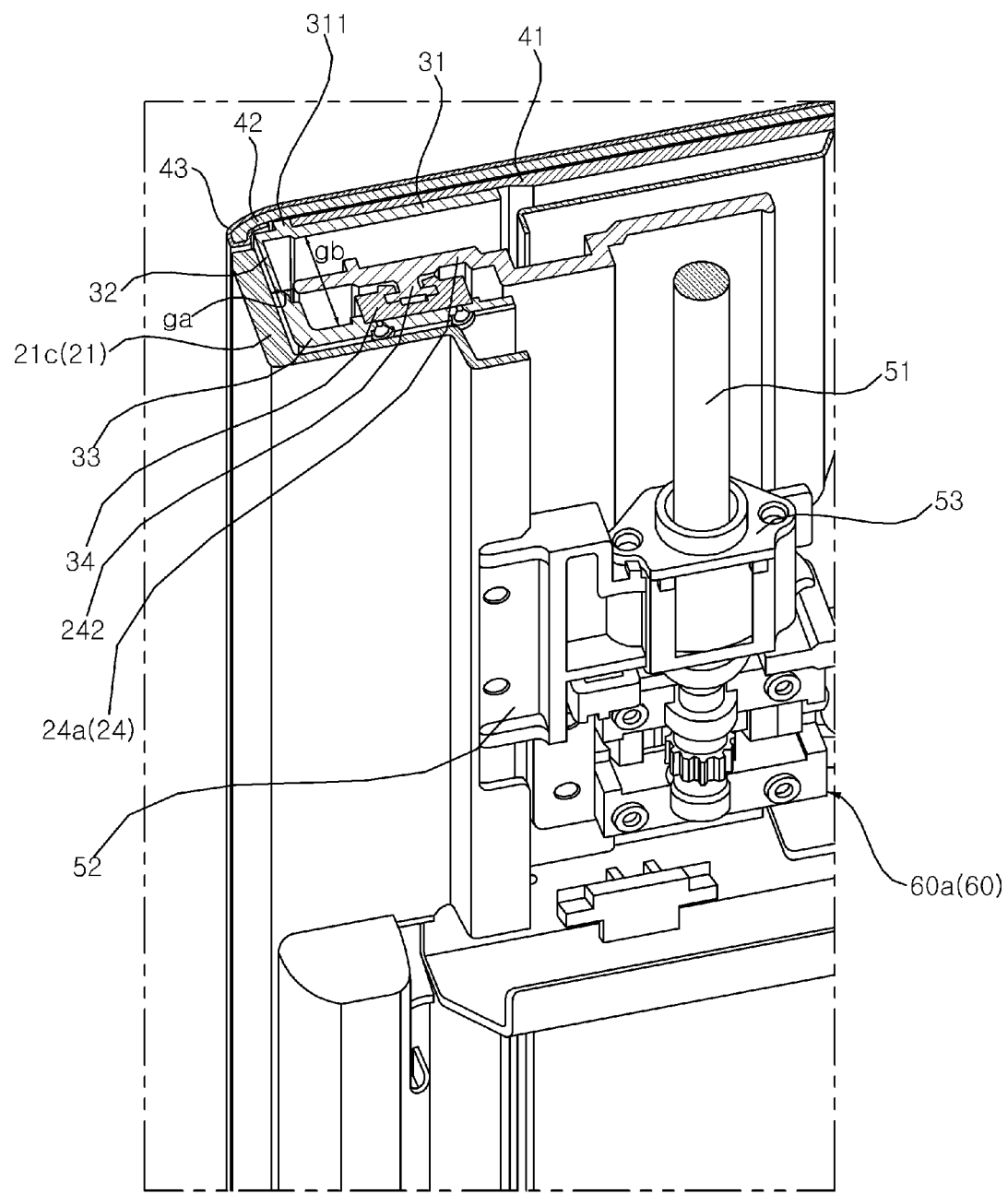

Referring to FIGS. 11 and 12, the third outer frame 21c may cover the side surface and the rear of the first supporter 30a, and the cover assembly (40: 41, 42, 43) may cover the front of the first supporter 30a. The first gap ga may be formed between the third outer frame 21c and the first guide frame 24a. That is, the second part 32 of the first supporter 30a may be disposed in the first gap ga, and the first supporter 30a and the cover assembly 40 may be disposed to be movable in the vertical direction with respect to the third outer frame 21c and the first guide frame 24a.

In this case, the first supporter 30a may surround a part of the first guide frame 24a. In other words, the second gap gb may be formed between the first part 31 and the third part 33 of the first supporter 30a, and a part of the first guide frame 24a may be disposed in the second gap gb.

Meanwhile, the description of the first supporter 30a with respect to the third outer frame 21c and the first guide frame 24a may be identically applied to the description of the second supporter 30b with respect to the fourth outer frame 21d and the second guide frame 24b (refer to FIG. 8).

Figure 13:
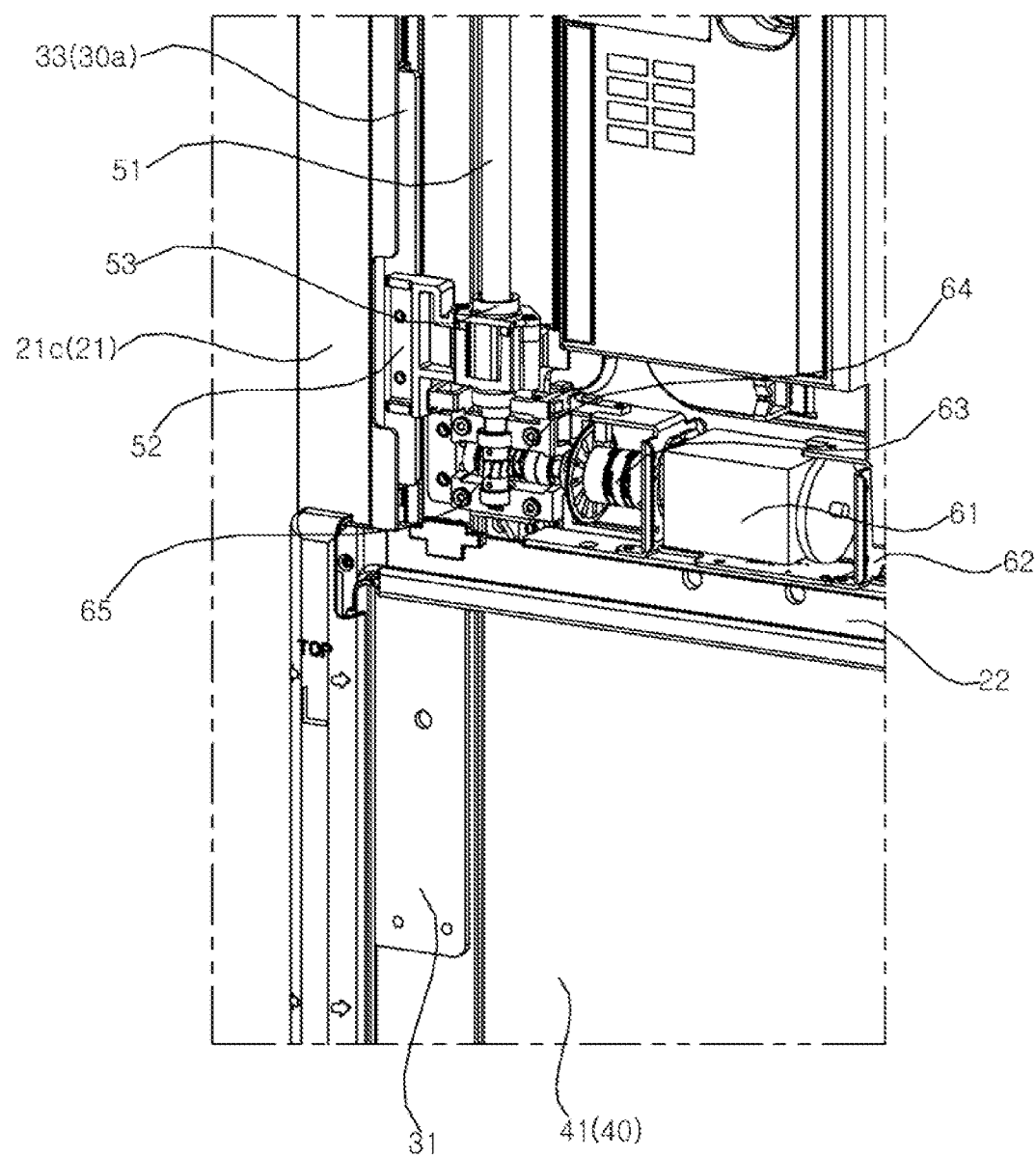

Referring to FIGS. 12 and 13, a first lift assembly 60a may be located at the rear of the first guide frame 24a and installed on the lower frame 22. The first lift assembly 60a may provide power to the first supporter 30a. Specifically, the first lift assembly 60a may include a motor 61, a motor mount 62, a torque limiter 63, a worm 64, a worm wheel 65, a lead screw 51, a connector 52, and a cap 53.

The motor 61 may provide rotational force. The motor 61 may be installed on the lower frame 22 through the motor mount 62. The torque limiter 63 may be connected to the rotation shaft of the motor 61 to limit the torque of the motor.

The worm 64 may be fixed to the rotation shaft of the motor 61 and rotate together with the rotation shaft. For example, the worm 64 may extend in the left-right direction and rotate about an axis parallel to the left-right direction. The worm wheel 65 may be engaged with a thread formed on the outer circumferential surface of the worm 64. The worm wheel 65 may extend in the vertical direction and may rotate about an axis parallel to the vertical direction.

The lead screw 51 may extend long in the vertical direction, and the lower end of the lead screw 51 may be fixed to the worm wheel 65. The male thread may be formed on the outer circumferential surface of the lead screw 51.

A connector 52 may be formed in a block shape as a whole. A connector hole (unsigned) may be formed to penetrate the connector 52 in the vertical direction, and the lead screw 51 may penetrate the connector hole. A female thread may be formed in a portion forming a boundary of the connector hole of the connector 52 and engaged with the male thread. One side of the connector 52 may be coupled to or fixed to the third part 33 of the first supporter 30a.

The cap 53 may be provided in the upper side of the connector 52. The cap 53 may be formed in a ring shape as a whole. The lead screw 51 may penetrate the connector hole and the cap 53.

The rail 242 may protrude from the rear surface of the first guide frame 24a toward the third part 33 of the first supporter 30a, and may be spaced apart from the third part 33. The rail 242 may extend long in the vertical direction. The rail 242 may be formed in a H-beam or I-beam shape as a whole. The rail 242 may guide the vertical movement of a slider 34 described later.

The slider 34 may be provided on the front surface of the third part 33 of the first supporter 30a, and the slider 34 may surround a part of the rail 242. That is, the slider 34 may be movably coupled to the rail 242 in the vertical direction. For example, the slider 34 may include at least two sliders spaced apart from each other in the vertical direction.

Accordingly, when the motor 61 is driven, the first supporter 30a may move in the vertical direction along the lead screw 51.

Meanwhile, a second lift assembly 60b may be located at the rear of the second guide frame 24b and installed on the lower frame 22 (refer to FIG. 8). The second lift assembly 60b may provide power to the second supporter 30b. The second lift assembly 60b and the first lift assembly 60a may be symmetrical left and right with respect to a reference line VV' (refer to FIG. 8).

Accordingly, in response to the operation of the first lift assembly 60a and the second assembly 60b, the cover assembly 40 fixed to the first supporter 30a and the second supporter 30b may ascend or descend.

Figure 14:
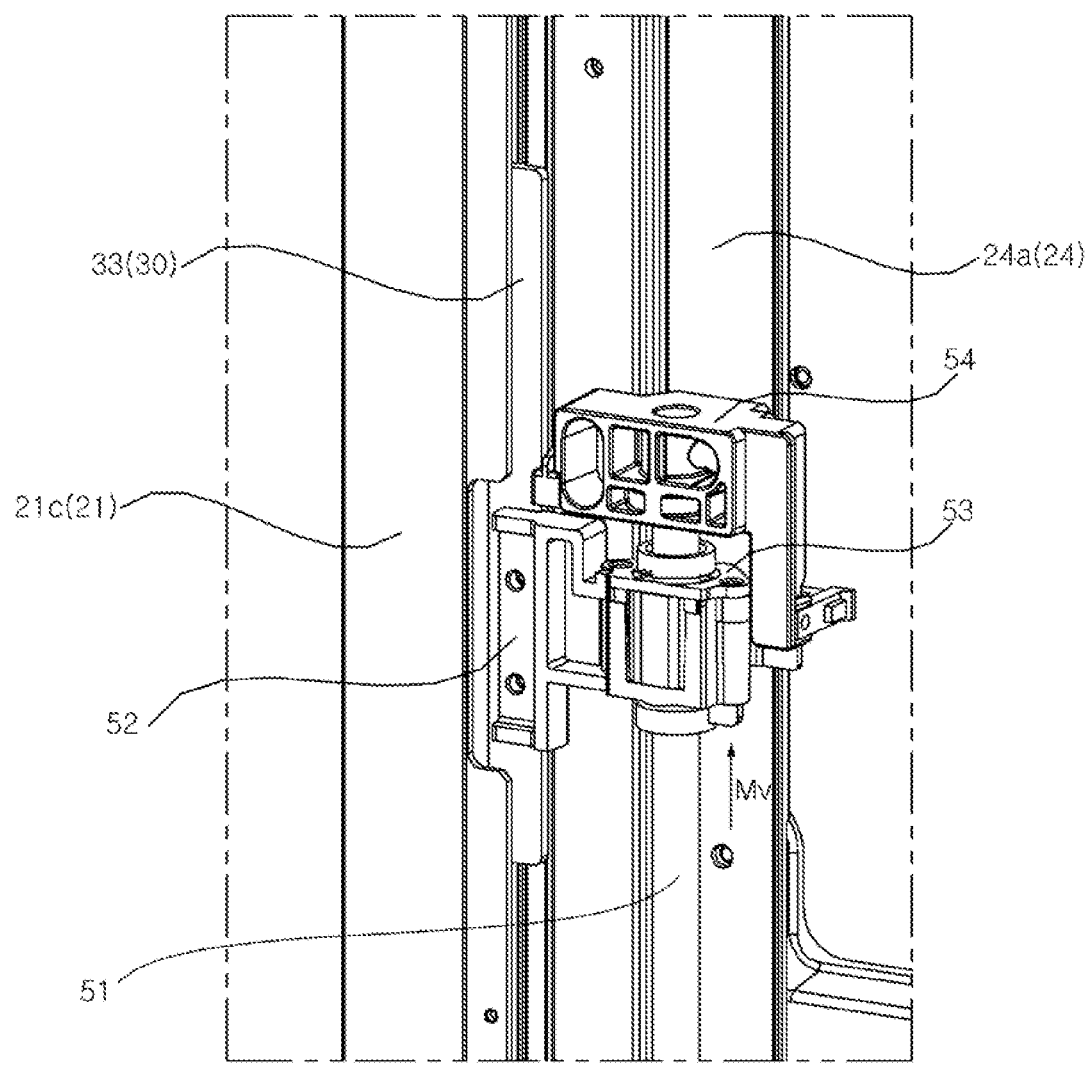

Referring to FIG. 14, a stopper 54 may be fixed to the first guide frame 24a at the rear of the first guide frame 24a. The upper end of the lead screw 51 may be rotatably coupled to the lower side of the stopper 54. The cap 53 may face the lower side of the stopper 54, and may be detachably coupled to the lower side of the stopper 54. Meanwhile, the stopper 54 may be referred to as a holder.

Accordingly, when the cap 53 is coupled to the stopper 54, the stopper 54 may limit the ascending My of the connector 52 corresponding to the rotation of the lead screw 51.

Figure 15:
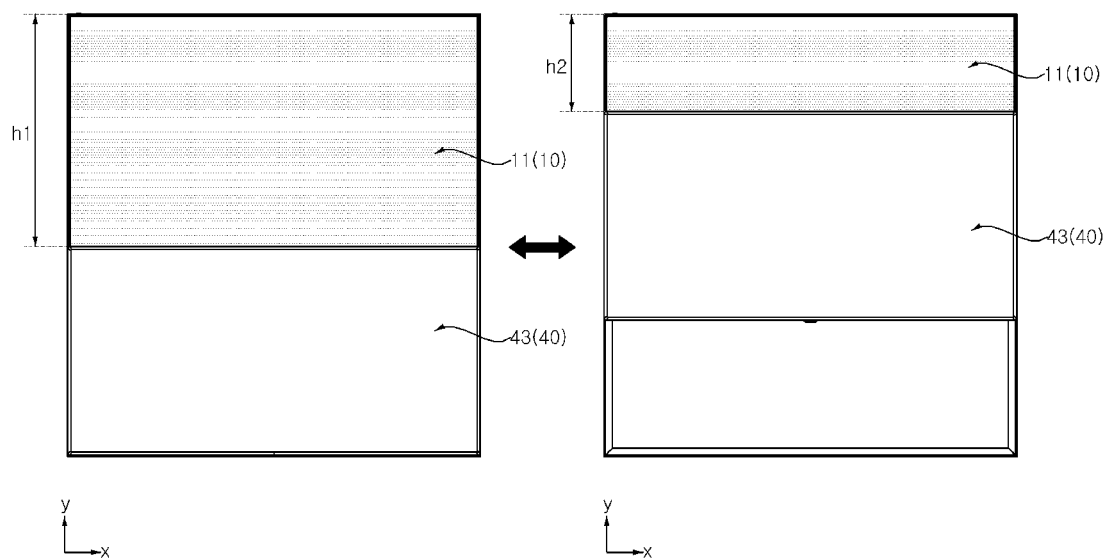

Referring to FIG. 15, the cover 43 may move in the vertical direction at the front of the display panel 11.

Referring to the left drawing of FIG. 15, in a first state of the display device, the cover 43 may not cover the display panel 11. In this case, the height h1 of an area exposed to the front of the display panel 11 may be a total height of the display panel 11.

Referring to the right drawing of FIG. 15, in a second state of the display device, the cover 43 may cover at least a part of the display panel 11. In this case, the height h2 of an area exposed to the front of the display panel 11 may be smaller than the total height of the display panel 11.

That is, the cover 43 may gradually cover the display panel 11 while ascending, or may gradually expose the display panel 11 while descending.

Figure 16:
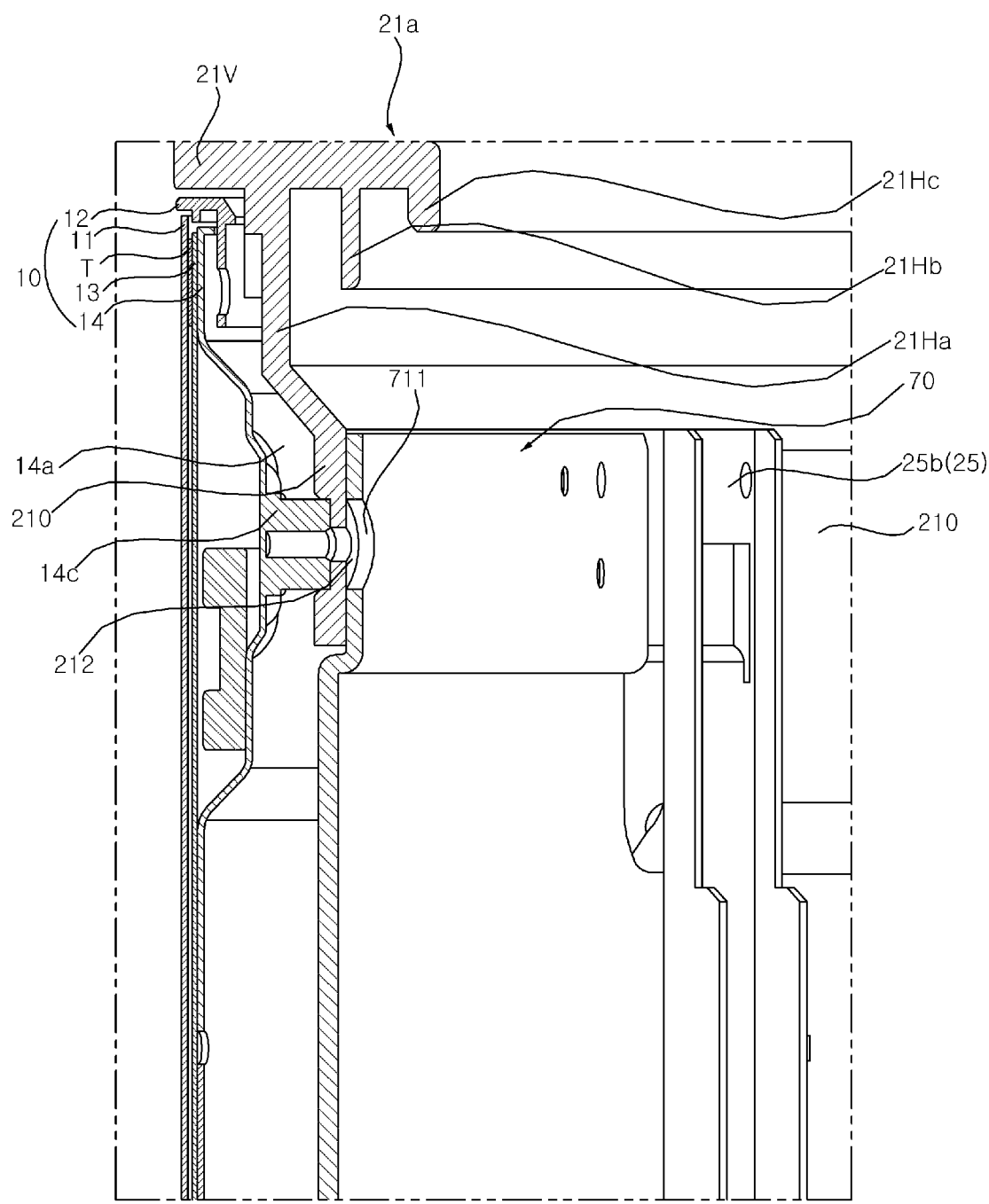

Referring to FIG. 16, a mount 70 may be coupled to the coupling part 210 at the rear of the coupling part 210. At this time, the coupling part 210 may be coupled to the module cover 14 and the mount 70 between the module cover 14 and the mount 70.

A fixing part 14c may protrude from the rigid part 14a of the module cover 14 toward the coupling part 210, and a part of the fixing part 14c may be inserted into the coupling part 210. The fixing part 14c, the coupling part 210, and the mount 70 may be coupled to each other through a fastening member. For example, the coupling hole 212 may be formed to penetrate the coupling part 210, and the mount hole 711 may be formed to penetrate the mount 70. In this case, in the front-rear direction, the coupling hole 212 and the mount hole 711 may be arranged in the fixing part 14c, and the fixing part 14c may be a pemnut fastened with a screw.

Accordingly, the mount 70 may be integrally coupled to the first outer frame 21a and the module cover 14. In addition, as the fixing part 14c is provided in the rigid part 14a, the torsional rigidity and/or bending rigidity of the first outer frame 21a may be improved.

Figure 17:
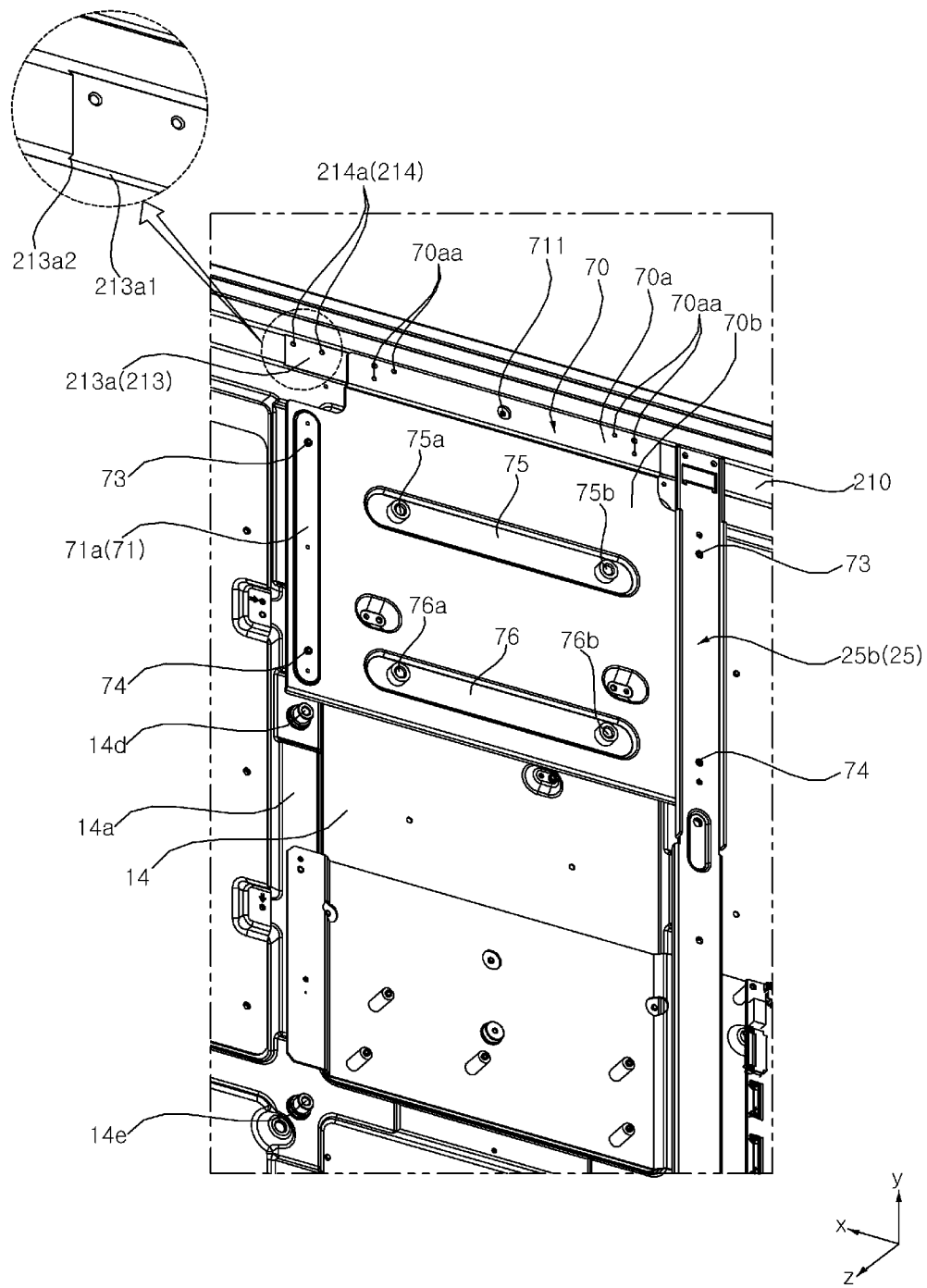
Figure 18:
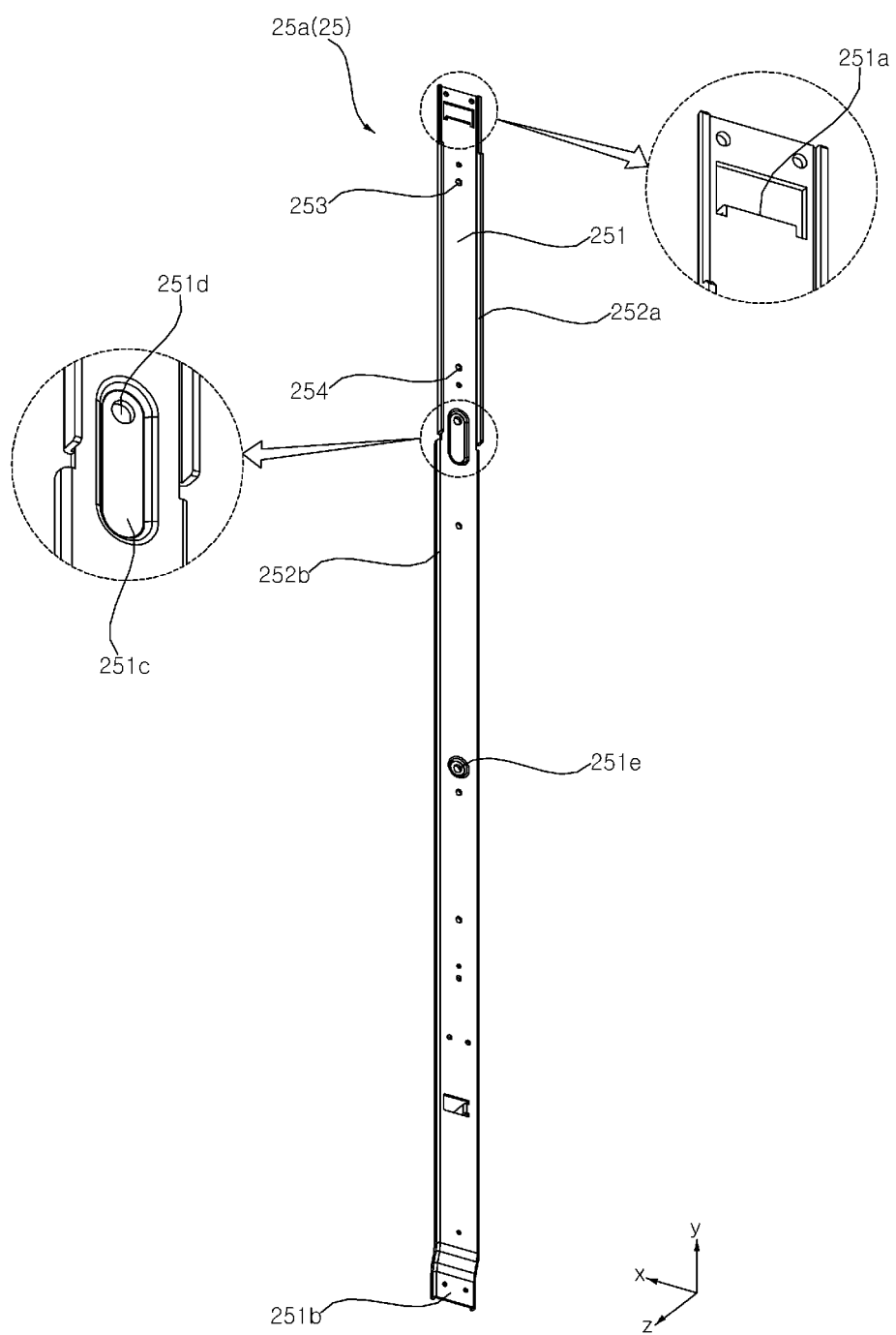

Referring to FIGS. 17 and 18, a seating portion 213a may be formed while lowering from the rear surface of the coupling part 210 to the front, and may extend long in the left and right direction. The thickness of the lower end 213a1 of the seating portion 213a may be smaller than the thickness of a portion in which the seating portion 213a of the coupling part 210 is not formed. In the length direction of the seating portion 213a, a distal end 213a2 of the seating portion 213a may be formed to be stepped with respect to a portion in which the seating portion 213a of the coupling part 210 is not formed. Meanwhile, the distal end 213a2 of the seating portion 213a may be a left end 213a2 or a right end 213a2 of the seating portion 213a.

The mount 70 may include a contact portion 70a and a flat plate portion 70b.

The contact portion 70a may contact the rear surface of the seating portion 213a. For example, a front boss 70aa may protrude from the contact portion 70a toward the seating portion 213a and be inserted into an insertion groove provided on the rear surface of the seating portion 213a. For another example, the front boss may protrude from the seating portion 213a toward the contact portion 70a and be inserted into the insertion groove provided on the front surface of the contact portion 70a. Accordingly, the coupling of the contact portion 70a to the seating portion 213a may be guided. Meanwhile, the contact portion 70a may be screw-coupled to the seating portion 213a near the front boss 70aa.

The flat plate portion 70b may be formed while being lowered toward the front with respect to the contact portion 70a, and may face the rear surface of the module cover 14. In this case, a step portion (no reference numeral) may be formed between the contact portion 70a and the flat plate portion 70b, and may contact or engage with the lower end 213a1 of the seating portion 213a. Accordingly, the coupling of the mount 70 to the seating portion 213a may be guided.

The bar 25 may be coupled to the seating portion 213a and the mount 70 at the rear of the seating portion 213a and the mount 70. The bar 25 may include a body 251 extend long in the vertical direction.

For example, the bar 25 may include a first bar 25a and a second bar 25b that are spaced apart from each other in the left and right direction. The first bar 25a may be adjacent to the left side of the mount 70, and may be coupled to the seating portion 213a and the mount 70. The second bar 25b may be adjacent to the right side of the mount 70, and may be coupled to the seating portion 213a and the mount 70.

A protrusion 251a may be adjacent to the upper end of the body 251, and may protrude to the front from the body 251. For example, the protrusion 251a may be formed such that a part of the body 251 is cut and bent to the front. The protrusion 251a may contact or engage with the lower end 213a1 of the seating portion 213a. Accordingly, the coupling of the bar 25 to the seating portion 213a may be guided. Meanwhile, a part of the body 251 may be located in the upper side of the protrusion 251a, may contact the seating portion 213a, and may be screw-coupled to a fastening hole 214a of the seating portion 213a.

An insertion part 251b may be provided in the lower end of the body 251, and may be bent to the front from the body 251. The insertion part 251b may be inserted into the lower frame 22 (refer to FIG. 8) and coupled to the lower frame 22 through a fastening member such as a screw. Accordingly, the bar 25 may be coupled to the first outer frame 21*a* and the lower frame 22 between the first outer frame 21*a* (refer to FIG. 8) and the lower frame 22.

An upper bending part 252*a* may be bent to the rear from the side end of the body 251. The upper bending part 252*a* may extend long in the vertical direction. In the length direction of the upper bending part 252*a*, one end of the upper bending part 252*a* may be provided in the upper end of the body 251. For example, the upper bending part 252*a* provided in the first bar 25*a* may contact or engage with the left end of the seating portion 213*a*, and may be referred to as a first upper bending part. For example, the upper bending part 252*a* provided in the second bar 25*b* may contact or engage with the right end of the seating portion 213*a*, and may be referred to as a second upper bending part. Accordingly, the coupling of the bar 25 to the seating portion 213*a* may be guided.

The lower bending part 252*b* may be spaced to the lower side from the upper bending part 252*a*, and may be bent to the front from the side end of the body 251. Accordingly, the lower bending part 252*b* and the upper bending part 252*a* may improve the rigidity of the bar 25 and minimize interference of cables with them. In other words, it may be advantageous that the upper bending part 252*a* is bent to the rear in consideration of the coupling of the bar 25 with respect to the mount 70 and the seating portion 213*a* located in the front of the body 251. In addition, it may be advantageous that the lower bending part 252*b* is bent to the front in order to minimize interference with a cable located in the rear of the lower bending part 252*b*.

A bar rigid part 251*c* may be formed while being pressed toward the front from the rear surface of the body 251. At least a part of the bar rigid part 251*c* may be disposed between the lower end of the upper bending part 252*a* and the upper end of the lower bending part 252*b*. For example, the upper portion of the bar rigid part 251*c* may be located in the upper side of the lower end of the upper bending part 252*a*, and the lower portion of the bar rigid part 251*c* may be located in the lower side of the upper end of the lower bending part 252*b*. Accordingly, the bar rigid part 251*c* may supplement or improve the rigidity between the upper bending part 252*a* and the lower bending part 252*b*.

Figure 19:
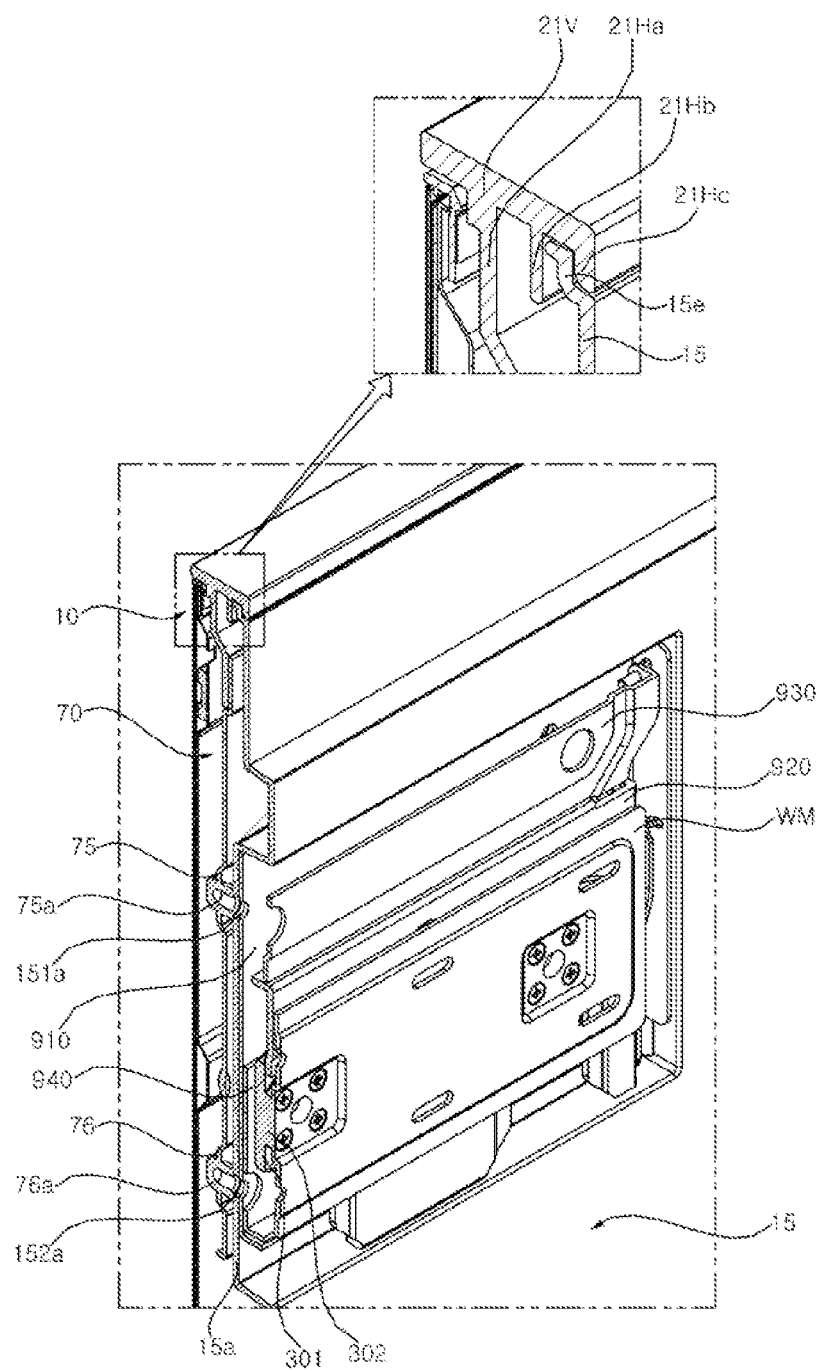

Referring to FIGS. 17 and 19, the mount 70 may include a vertical rigid part 71 and horizontal rigid parts 75 and 76.

The vertical rigid part 71 may be formed while being pressed from the front surface to the rear of the mount 70, and may extend in the length direction of the bar 25. For example, the first vertical rigid part 71*a* may be adjacent to the left side of the mount 70 and may face the front surface of the first bar 25*a*. For example, the second vertical rigid part may be adjacent to the right side of the mount 70 and face the front surface of the second bar 25*b*.

In addition, the rear boss 73, 74 may protrude from the rear surface of the vertical rigid part 71 toward the bar 25, that is, protrude to the rear. For example, the rear boss 73, 74 may include rear bosses spaced apart from each other in the vertical direction that is the length direction of the vertical rigid part 71. The insertion hole 253, 254 may be formed to penetrate the body 251, and the rear boss 73, 74 may be inserted thereinto. Thus, the coupling of the bar 25 to the vertical rigid part 71 may be guided. Meanwhile, the body 251 may be screw-coupled to the vertical rigid part 71.

The horizontal rigid part 75, 76 may be formed while being pressed to the front from the rear surface of the mount 70, and may extend in a direction intersecting the length direction of the bar 25. That is, the horizontal rigid part 75, 76 may be formed while being pressed in the opposite direction to the vertical rigid part 71, and extend in a direction intersecting the vertical rigid part 71, so that the torsional rigidity and/or bending rigidity of the mount 70 can be greatly improved. For example, the first horizontal rigid part 75 may be closer to the upper side of the mount 70 than the lower side, and may extend long in the left and right direction. For example, the second horizontal rigid part 76 may be located in the lower side of the first horizontal rigid part 75 and extend long in the left and right direction.

In addition, a first bracket fixing part 75*a*, 75*b* may protrude to the rear from the rear surface of the first horizontal rigid part 75. A second bracket fixing part 76*a*, 76*b* may protrude to the rear from the rear surface of the second horizontal rigid part 76. In addition, each of the first bracket fixing part 75*a*, 75*b* and the second bracket fixing part 76*a*, 7*b* may be provided as a pair of bracket fixing parts spaced apart from each other left and right.

Meanwhile, a bar fixing part 14*d*, 14*e* may protrude toward the bar 25 from the rear surface of the rigid part 14*a*. The bar fixing part 14*d*, 14*e* and the bar 25 may be coupled to each other through a fastening member. For example, a bar hole 251*d*, 251*e* (refer to FIG. 18) may be formed to penetrate the body 251. In this case, in the front-rear direction, the bar hole 251*d*, 251*e* may be arranged in the bar fixing part 14*d*, 14*e*, and the bar fixing part 14*d*, 14*e* may be a pemnut fastened with a screw.

For example, the first bar fixing part 14*d* may be adjacent to the lower side of the mount 70, but may be spaced to the lower side from the lower end of the mount 70. The first bar hole 251*d* may be formed to penetrate the bar rigid part 251*c* and may be arranged in the first bar fixing part 14*d*.

For example, the second bar fixing part 14*e* may be spaced to the lower side from the first bar fixing part 14*d*. The second bar hole 251*e* may be spaced to the lower side from the first bar hole 251*d*, may be formed to penetrate the body 251, and may be arranged in the second bar fixing part 14*e*.

Accordingly, the bar 25 may be integrally coupled to the first outer frame 21*a*, the mount 70, and the module cover 14. That is, it is possible to minimize deformation or damage of the structure of the display device such as the frame 20 due to the load applied to the mount 70 through the bracket 900 described later.

Figure 20:
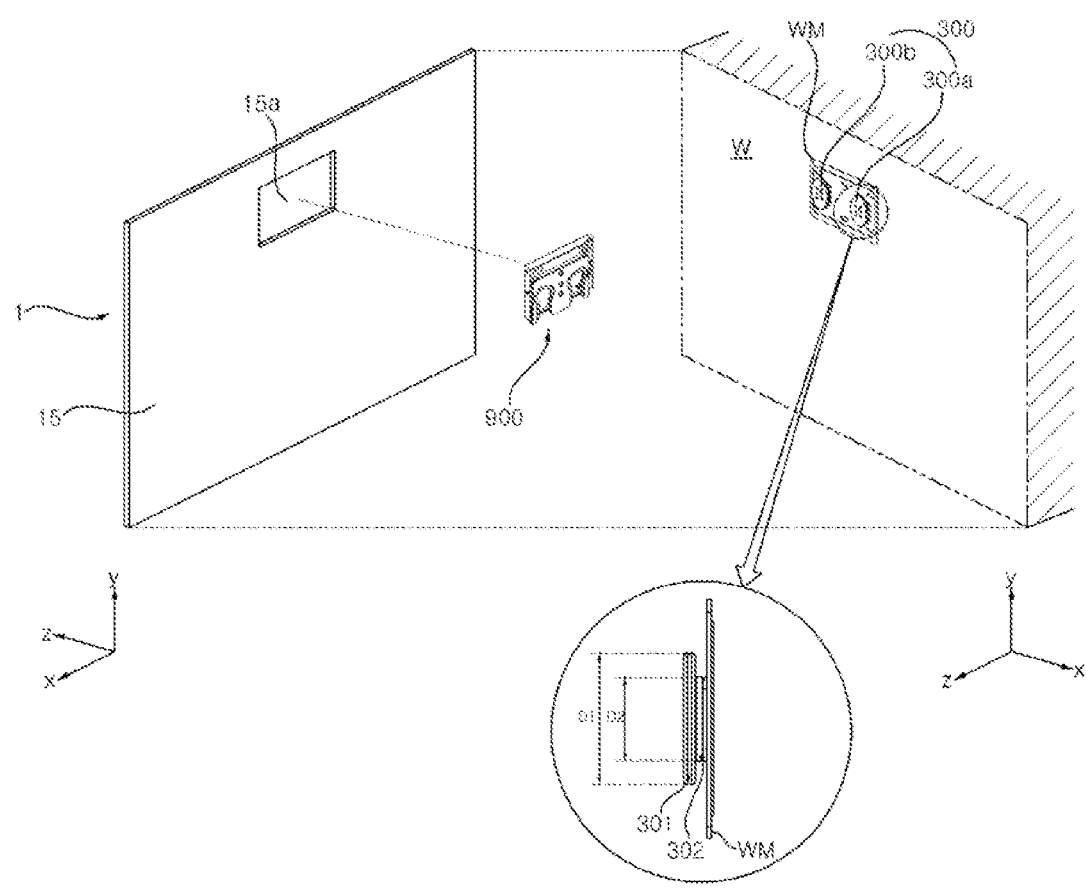

Referring to FIGS. 19 and 20, a back cover 15 may form a rear surface of the display device 1. The back cover 15 may cover the rear of the module cover 14 and the mount 70. The distal end 15*e* of the back cover 15 may be disposed between the second horizontal portion 21Hb and the third horizontal portion 21Hc.

A mounting part 15*a* may be formed while being pressed toward the mount 70 from the rear surface of the back cover 15. The mounting part 15*a* may be disposed between the mount 70 and a bracket 900 described later. A mounting hole 151*a*, 152*a* may be formed to penetrate the mounting part 15*a*, and arranged in the bracket fixing part 75*a*, 75*b*, 76*a*, and 76*b*. For example, a first mounting hole 151*a* may be a pair of holes spaced apart from each other in the left and right, and may be arranged in the first bracket fixing part 75*a*, 75*b*. For example, a second mounting hole 152*a* may be a pair of holes spaced apart from each other in the left and right, and may be arranged in the second bracket fixing part 76*a* and 76*b*. Meanwhile, the mounting hole 151*a*, 152*a* may be referred to as a video electronics standards association (VESA) hole.

The display device 1 may be installed in a fixture W through a bracket 900 coupled to the back cover 15 and a pin 300 fixed to the fixture W such as a wall. Meanwhile, the pin 300 may be referred to as a supporter, a holder, or a spacer.

The bracket 900 may be coupled to the mounting part 15a through a fastening member such as a screw at the rear of the back cover 15. In addition, the pin 300 may be fixed to the fixture W through a fastening member such as a nail or a screw. In addition, a wall mount WM may be disposed between the pin 300 and the fixture W to guide the coupling of the pin 300 to the fixture W. At this time, the bracket 900 fixed to the back cover 15 may approach the pin 300 from the upper side of the pin 300 and be coupled to the pin 300, or may be separated from the pin 300 away from the pin 300.

The pin 300 may include a head 301 and a neck 302. The head 301 forms the front surface of the pin 300, and may be opposite the wall mount WM with respect to the neck 302. The neck 302 may protrude to the rear from the rear surface of the head 301. That is, the neck 302 may be disposed between the head 301 and the wall mount WM. The head 301 and the neck 302 may be formed in a circular plate or disk shape. The diameter D2 of the neck 302 may be smaller than the diameter D1 of the head 301. A fastening member such as a nail or screw may be coupled to the fixture W by sequentially penetrating the head 301, the neck 302, and the wall mount WM.

For example, the pin 300 may include a first pin 300a and a second pin 300b that are spaced apart from each other in the left and right direction.

Figure 21:
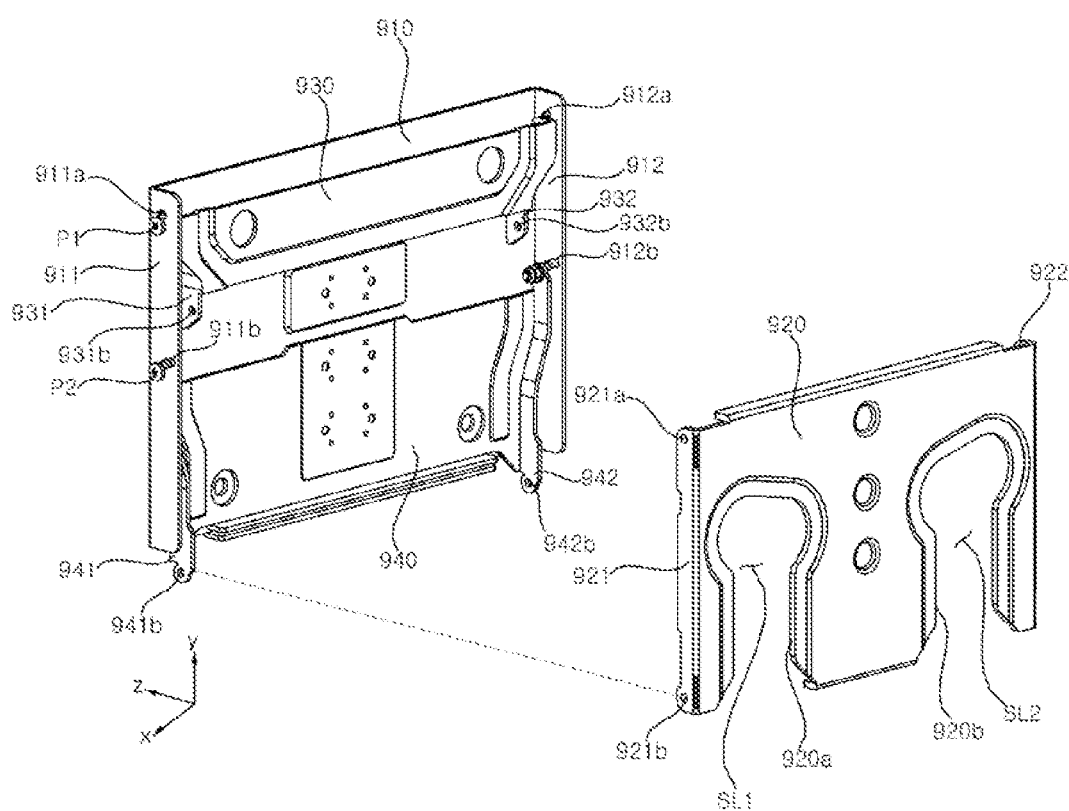

Referring to FIGS. 19 and 21, the bracket 900 may include a first plate 910, a second plate 920, and a link 930, and 940.

The first plate 910 may form the front surface of the bracket 900. The first plate 910 may be coupled to the mounting part 15a. That is, a fastening member such as a screw may be coupled to the bracket fixing part 75a, 75b, 76a, 76b through the first plate 910 and the mounting hole 151a, 152a.

In addition, a first left wing 911 may be bent to the rear from the left side of the first plate 910. The first left wing 911 may extend long in the vertical direction. A first upper groove 911a may be adjacent to the upper end of the first left wing 911 and may be formed to penetrate the first left wing 911. The first upper groove 911a may extend in an arc shape. A first lower groove 911b may be located in the lower side of the first upper groove 911a and may be formed to penetrate the first left wing 911. The first lower groove 911b extends in an arc shape, and the length of the first lower groove 911b may be greater than the length of the first upper groove 911a.

In addition, the first right wing 912 may be bent to the rear from the right side of the first plate 910. The first right wing 912 may extend long in the vertical direction. The second upper groove 912a may be adjacent to the upper end of the first right wing 912 and may be formed to penetrate the first right wing 912. The second upper groove 912a may extend in an arc shape. For example, the second upper groove 912a may be symmetrical left and right with the first upper groove 911a with respect to a center line of the first plate 910. The second lower groove 912b may be located in the lower side of the second upper groove 912a and may be formed to penetrate the first right wing 912. The second lower groove 912b extends in an arc shape, and the length of the second lower groove 912b may be greater than the length of the second upper groove 912a. For example, the second lower groove 912b may be symmetrical left and right with the first lower groove 911b with respect to a center line of the first plate 910.

The second plate 920 may form a rear surface of the bracket 900. The second plate 920 may be opposite the first plate 910. A first slot SL1 and a second slot SL2 may be spaced apart from each other in the left and right direction, and may be formed from the lower side of the second plate 920 toward the inside of the second plate 920. A first guide part 920a may form a boundary of the first slot SL1, and may guide the movement of the first pin 300a inserted into the first slot SL1. In this case, the first guide part 920a may be disposed between a head 301 of the first pin 300a and the wall mount WM to be engaged with the neck 302 of the first pin 300a. A second guide part 920b may form a boundary of the second slot SL2 and may guide the movement of the second pin 300b inserted into the second slot SL2. In this case, the second guide part 920b may be disposed between the head 301 of the second pin 300b and the wall mount WM to be engaged with the neck 302 of the second pin 300b.

In addition, the second left wing 921 may be bent to the front from the left side of the second plate 920. The second left wing 921 may extend long in the vertical direction. The second left wing 921 may be located inside the first left wing 911. A first upper hole 921a may be adjacent to the upper end of the second left wing 921 and may be formed to penetrate the second left wing 921. The first lower hole 921b may be adjacent to the lower end of the second left wing 921, and may be formed to penetrate the second left wing 921.

In addition, the second right wing 922 may be bent to the front from the right side of the second plate 920. The second right wing 922 may extend long in the vertical direction. The second right wing 922 may be located inside the first right wing 912. A second upper hole (not shown) may be adjacent to the upper end of the second right wing 922 and may be formed to penetrate the second right wing 922. For example, the second upper hole may be symmetrical left and right with the first upper hole 921a with respect to a center line of the second plate 920. A second lower hole (not shown) may be adjacent to the lower end of the second right wing 922, and may be formed to penetrate the second right wing 922. For example, the second lower hole may be symmetrical left and right with the first lower hole 921b with respect to a center line of the second plate 920.

Meanwhile, the first upper hole 921a and the second upper hole may be located in the lower side of the first upper groove 911a and the second upper groove 912a. The first lower hole 921b and the second lower hole may be located in the lower side of the first lower groove 911b and the second lower groove 912b.

The link 930, 940 may extend between the first plate 910 and the second plate 920 in a direction intersecting the first plate 910 and the second plate 920. The link 930, 940 may be pivotably coupled to the first plate 910 and the second plate 920. The link 930, 940 may include an upper link 930 and a lower link 940. The upper link 930 may be located in the upper side of the lower link 940.

One side 931 of the upper link 930 may face the first left wing 911. One end of one side 931 of the upper link 930 may be pivotally and movably coupled to the first upper groove 911a, and the other end of one side 931 of the upper link 930 may be pivotably coupled to the first upper hole 921a. A fastening member P1 such as a bolt may be fastened to a nut to penetrate the first upper groove 911a and a hole (not shown) formed in the one end of one side 931. Meanwhile, the fastening member P1 may be referred to as an upper pivot shaft P1. A fastening member such as a bolt may be fastened to a nut to penetrate the first upper hole 921a and the hole 931b formed in the other end of one side 931.

The other side 932 of the upper link 930 may face the first right wing 912. One end of the other side 932 of the upper link 930 may be pivotally and movably coupled to the second upper groove 912a, and the other end of the other side 932 of the upper link 930 may be pivotably coupled to the second upper hole. A fastening member such as a bolt may be fastened to a nut to penetrate the second upper groove 912a and a hole (not shown) formed in one end of the other side 932. A fastening member such as a bolt may be fastened to a nut to penetrate the second upper hole and a hole 932b formed in the other end of the other side 932.

One side 941 of the lower link 940 may face the first left wing 911. One end of one side 941 of the lower link 940 may be pivotally and movably coupled to the first lower groove 911b, and the other end of one side 941 of the lower link 940 may be pivotally coupled to the first lower hole 921b. A fastening member P2 such as a bolt may be fastened to a nut to penetrate the first lower groove 911b and a hole (not shown) formed in the one end of one side 941. Meanwhile, the fastening member P2 may be referred to as a lower pivot shaft P2. A fastening member such as a bolt may be fastened to a nut to penetrate a hole 941b formed in the other end of one side 941 and the first lower hole 921b.

The other side 942 of the lower link 940 may face the first right wing 912. One end of the other side 942 of the lower link 940 may be pivotally and movably coupled to the second lower groove 912b, and the other end of the other side 942 of the lower link 940 may be pivotably coupled to the second lower hole. A fastening member such as a bolt may be fastened to a nut to penetrate the second lower groove 912b and a hole (not shown) formed in the one end of the other side 942. A fastening member such as a bolt may be fastened to a nut to penetrate a hole 942b formed in the other end of the other side 942 and the second lower hole.

Figure 22:
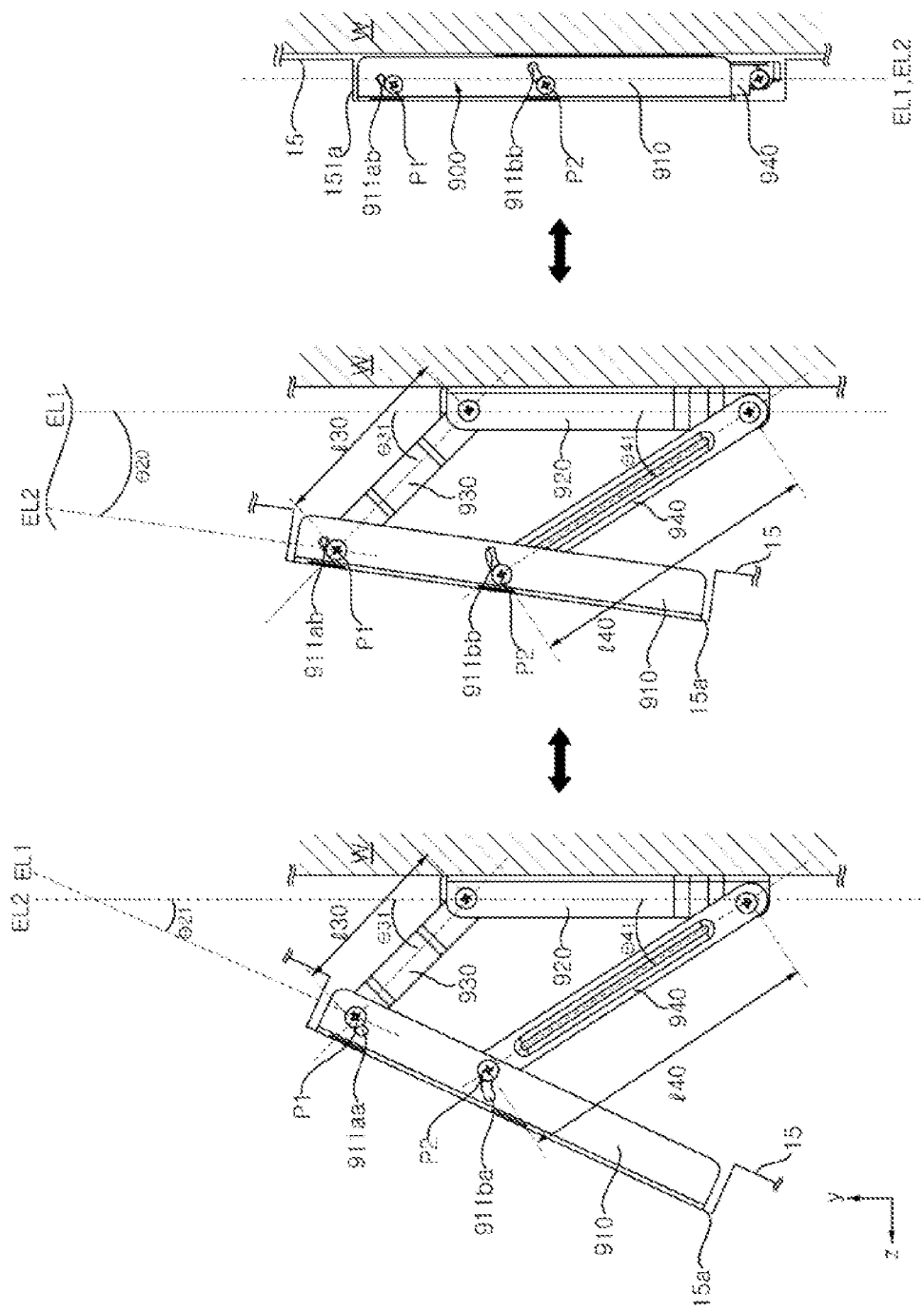

Referring to FIGS. 21 and 22, a first extension line EL1 may extend along the length direction of the first left wing 911 of the first plate 910. A second extension line EL2 may extend along the length direction of the second left wing 921 of the second plate 920. Meanwhile, a length 130 of the upper link 930 may be smaller than a length 140 of the lower link 940.

In the vertical direction, a front end 911aa of the first upper groove 911a may be arranged in a front end 911ba of the first lower groove 911b. In addition, the length of the first upper groove 911a may be smaller than the length of the first lower groove 911b. That is, a rear end 911ab of the first upper groove 911a may be located in the front of a rear end 911bb of the first lower groove 911b.

A user may adjust the angle or position of the first plate 910 with respect to the second plate 920 fixed to the fixture W through a pivot movement of the link 930, 940.

Referring to the left drawing of FIG. 22, the first extension line EL1 may be inclined at a first angle (theta 21) with respect to the second extension line EL2. That is, the first plate 910 may be inclined upwardly away from the front with respect to the second plate 920. To this end, the upper link 930 may be inclined at a second angle (theta 31) with respect to the second extension line EL2, and the lower link 940 may be inclined at a third angle (theta 41) smaller than the second angle (theta 31) with respect to the second extension line EL2. In addition, the upper pivot shaft P1 may be disposed in the rear end 911ab of the first upper groove 911a, and the lower pivot shaft P2 may be disposed in the rear end 911bb of the first lower groove 911b.

Accordingly, a user may easily check the positions of the pin 300a, 300b and the slot SL1, SL2 of the second plate 920. That is, the installation convenience of the bracket 900 for the fixture W and the display device 1 may be increased. In addition, a user may easily approach the rear of the back cover 15 while the bracket 900 and the display device 1 are fixed to the fixture W. That is, a user may conveniently connect or disconnect a cable or USB to various ports provided in the rear of the back cover 15.

Referring to the middle drawing of FIG. 22, the first extension line EL1 may be inclined at a fourth angle (theta 20) with respect to the second extension line EL2. Here, the fourth angle (theta 20) may be smaller than the first angle (theta 21). For example, the fourth angle (theta 20) may be 5 degrees, and the first angle (theta 21) may be 13 degrees. That is, compared with the left drawing of FIG. 22, the first plate 910 may be rotated counterclockwise. To this end, the upper pivot shaft P1 may be disposed in the front end 911aa of the first upper groove 911a, and the lower pivot shaft P2 may be disposed in the front end 911ba of the first lower groove 911b.

Accordingly, the display device 1 may maintain a tilted posture with respect to the fixture W. In this case, a shelf Sh (refer to FIG. 2) may be installed between the back cover 15 and the fixture W, and cables or electronic devices may be placed on the shelf Sh.

Referring to the right drawing of FIG. 22, the first extension line EL1 may be disposed parallel to the second extension line EL2. That is, the first plate 910 may be disposed parallel to the second plate 920. To this end, the upper link 930 and the lower link 940 may be rotated clockwise. In addition, the upper pivot shaft P1 may be disposed in the front end 911aa of the first upper groove 911a, and the lower pivot shaft P2 may be disposed in the front end 911ba of the first lower groove 911b.

Accordingly, the back cover 15 may be in contact with the fixture W, or a narrow gap may be formed between the back cover 15 and the fixture W. That is, the display device 1 may be in close contact with the fixture W as a whole. In this case, the shelf Sh (refer to FIG. 2) may be omitted.

Figure 23:
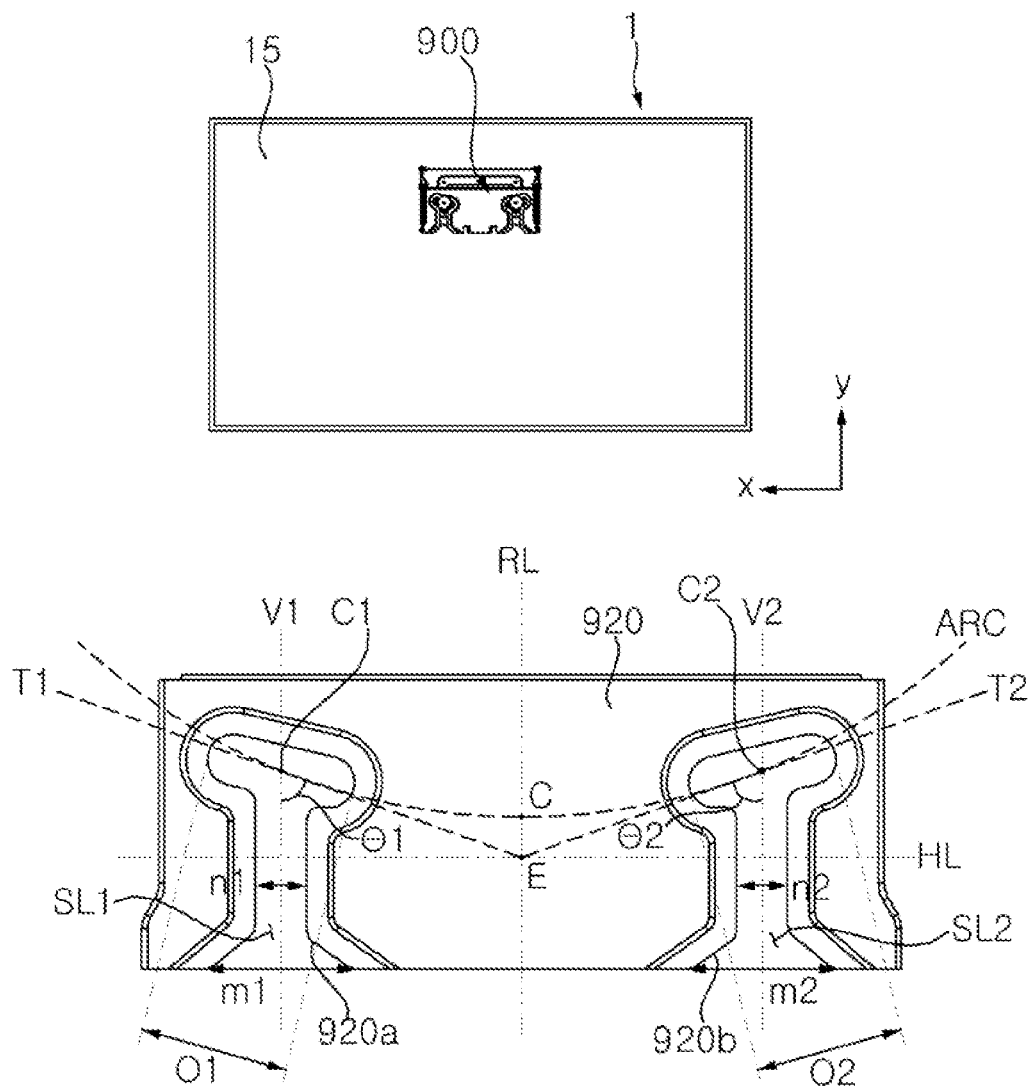

Referring to FIG. 23, the first slot SL1 and the second slot SL2 may be symmetrical left and right with respect to a vertical line RL extending vertically while passing through a center of the second plate 920.

The first slot SL1 may be adjacent to a left side of the second plate 920, and may be formed from a lower side of the second plate 920 toward the upper side. The first guide part 920a may form a boundary of the first slot SL1, and may include a first entry path, a first link path, and a first seating path. The width of the first entry path may be m1 at the lower end, and may become narrower toward the upper side. The first link path may be connected to an upper end of the first entry path, and the width of the first link path may be uniform as n1. The first seating path may be connected to the upper end of the first link path, and may be formed along a direction intersecting a first vertical line V1 that passes through the center C1 of the first seating path, and extends in the vertical direction. In addition, in the direction in which the first seating path is formed, the width of the first seating path may be O1. At this time, the width of the first entry path, the width of the first link path, and the width of the first seating path may be larger than the diameter D2 of the neck 302 of the first pin 300a, and be smaller than the diameter D1 of the head 301.

Accordingly, the first pin 300a fixed to the fixture W may easily enter the first entry path having a relatively large width, and be guided to the first seating path along the first link path. In addition, the neck 302 of the first pin 300a may support the lower side of the first seating path, and the head 301 of the first pin 300a may support the front of the first seating path.

The second slot SL2 may be adjacent to a right side of the second plate 920, and may be formed from a lower side of the second plate 920 toward an upper side. The second guide part 920b may form a boundary of the second slot SL2, and may include a second entry path, a second link path, and a second seating path. The width of the second entry path may be m2 at the lower end, and may become narrower toward the upper side. The second link path may be connected to the upper end of the second entry path, and the width of the second link path may be uniform as n2. The second seating path may be connected to the upper end of the second link path, and may extend along a direction intersecting a second vertical line V2 that passes through a center C2 of the second seating path and extends along a vertical direction. In addition, in the direction in which the second seating path is formed, the width of the second seating path may be O2. At this time, the width of the second entry path, the width of the second link path, and the width of the second seating path may be greater than the diameter D2 of the neck 302 of the second pin 300b, and may be smaller than the diameter D1 of the head 301.

Accordingly, the second pin 300b fixed to the fixture W may easily enter the second entry path having a relatively large width, and be guided to the second seating path along the second link path. In addition, the neck 302 of the second pin 300b may support the lower side of the second seating path, and the head 301 of the second pin 300b may support the front of the second seating path.

In addition, the first slot SL1 and the second slot SL2 may be symmetrical left and right. In addition, the center C1 of the first seating path and the center C2 of the second seating path may be located on a virtual arc ARC. Here, the arc ARC may intersect with the vertical line RL at the center point C.

In addition, a first tangent line T1 may come into contact with the arc ARC while passing through the center C1 of the first seating path. A second tangent line T2 may come into contact with the arc ARC while passing through the center C2 of the second seating path. The first tangent line T1 and the second tangent line T2 may intersect at an intersection point E on the vertical line RL, and the intersection point E may be located in the lower side of the central point C. That is, the first tangent line T1 may extend toward the intersection point E and may be inclined by a first angle (theta 1) with respect to the first vertical line V1. The second tangent line T2 may extend toward the intersection point E and may be inclined by a second angle (theta 2) identical with the first angle (theta 1) with respect to the second vertical line V2.

In this case, the first seating path may be formed along the first tangent line T1, and the second seating path may be formed along the second tangent line T2. Accordingly, when the first seating path and the second seating path are seated in the first pin 300a and the second pin 300b, the bracket 900 and the display device 1 coupled to the bracket 900 may maintain a uniform posture unless an external force is applied to the bracket 900.

Figure 24:
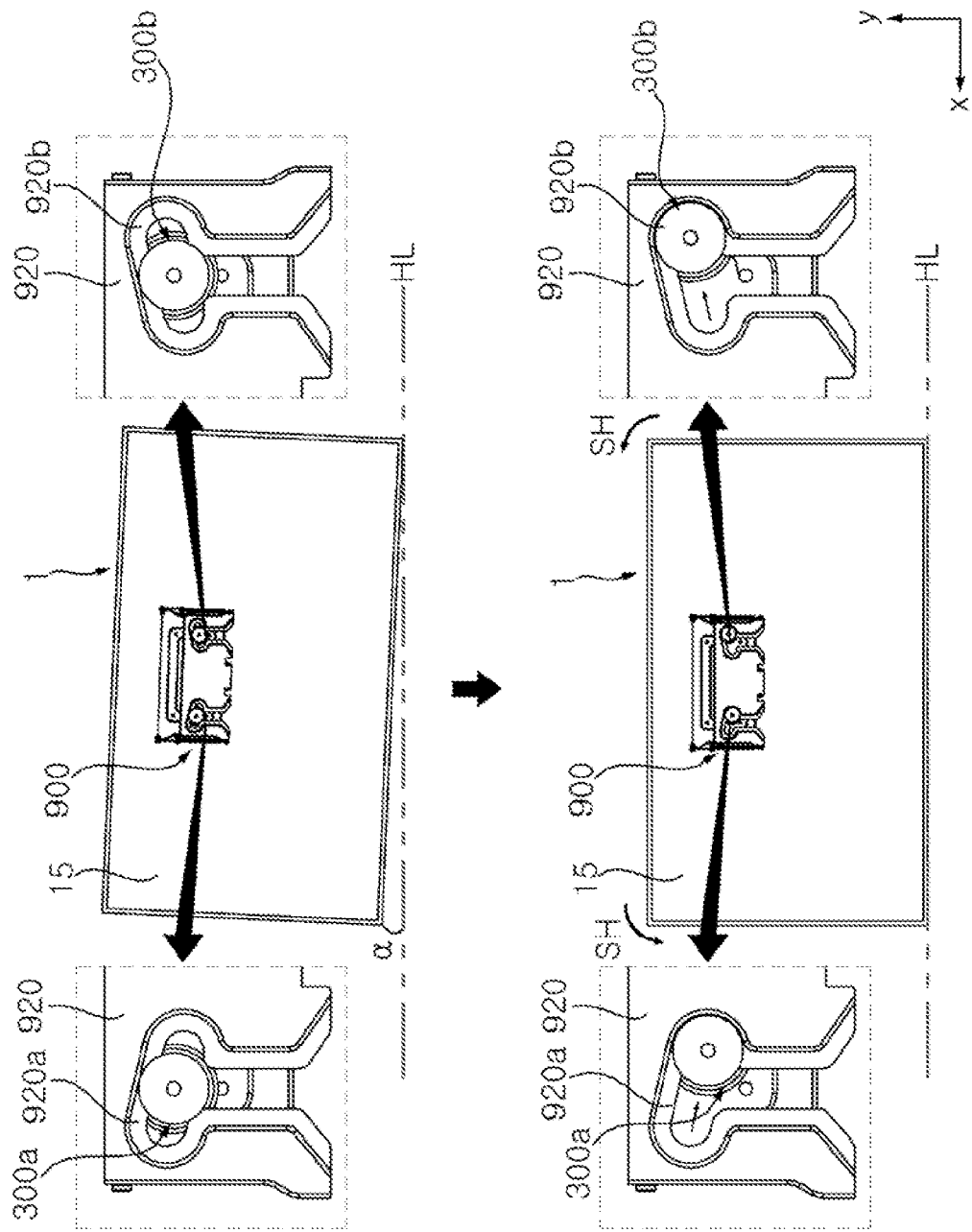
Figure 25:
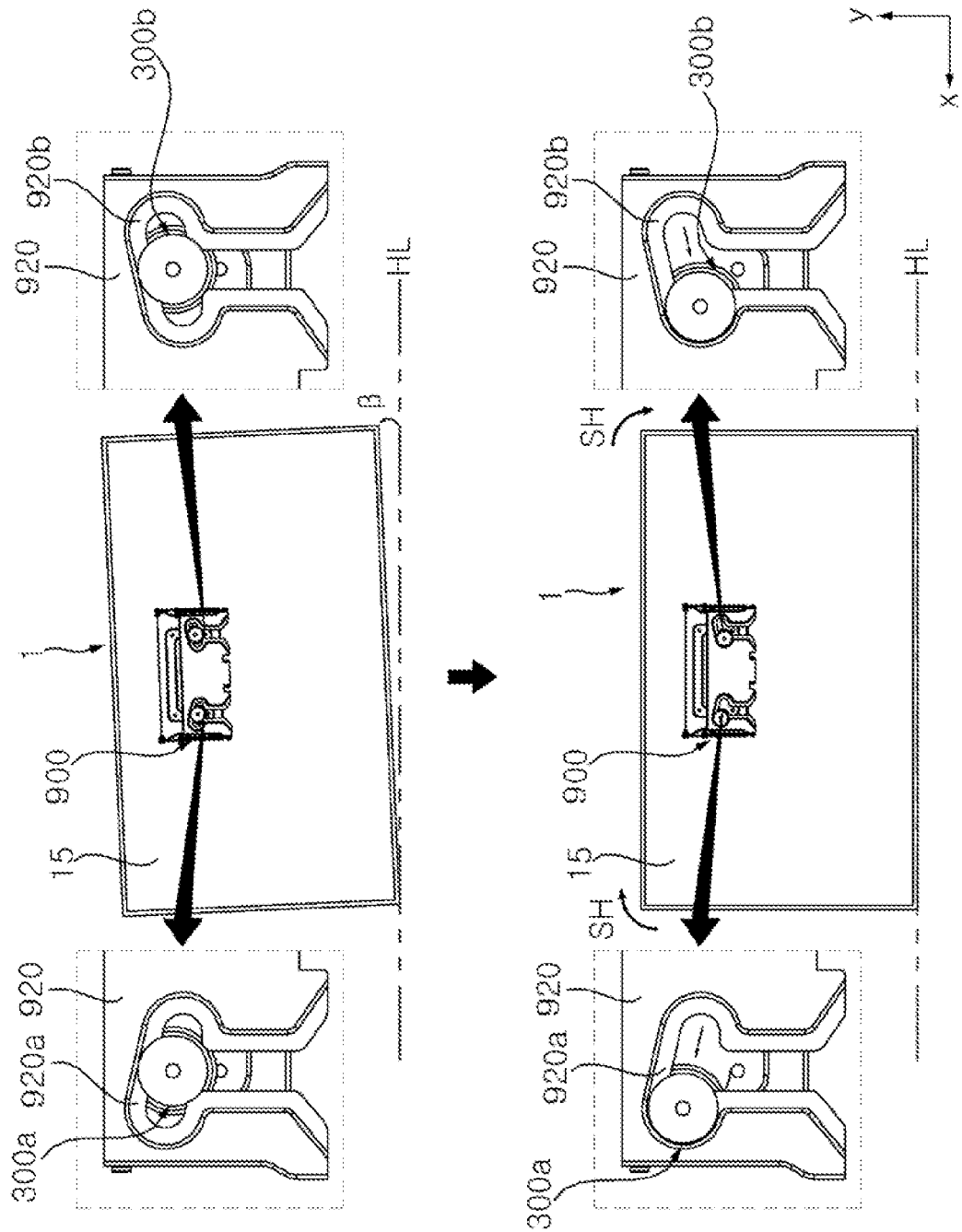

Referring to FIGS. 24 and 25, a user may adjust the positions of the first pin 300a and the second pin 300b with respect to the first guide part 920a and the second guide part 920b, so that the angle of the bracket 900 with respect to a horizontal line HL can be adjusted.

For example, the left side of the bracket 900 and the display device 1 coupled to the bracket 900 may be inclined to the upper side by a certain angle (alpha) with respect to the horizontal line HL. (refer to the upper drawing of FIG. 24). While shifting (SH) the left side of the display device 1 to the lower side, a user may perform an operation of shifting (SH) the right side of the display device 1 to the upper side, thereby leveling the display device 1 (refer to the lower drawing of FIG. 24). In this case, the first pin 300a may move to the right side on the first seating path to lower its position, and the second pin 300b may move to the right side on the second seating path to raise its position.

For example, the right side of the bracket 900 and the display device 1 coupled to the bracket 900 may be inclined to the upper side by a certain angle (beta) with respect to the horizontal line HL. (refer to the upper drawing of FIG. 25). While shifting (SH) the right side of the display device 1 to the lower side, a user may perform an operation of shifting (SH) the left side of the display device 1 to the upper side, thereby leveling the display device 1 (refer to the lower drawing of FIG. 25). In this case, the first pin 300a may move to the left side on the first seating path to raise its position, and the second pin 300b may move to the left side on the second seating path to lower its position.

According to an aspect of the present disclosure, provided is a display device including: a module cover; a display panel which is positioned in front of the module cover, and is coupled to the module cover; a frame which surrounds a side surface of the module cover, the frame including a first frame adjacent to one side of the module cover and a second frame adjacent to the other side of the module cover opposite to the one side of the module cover; a bar which is positioned behind the module cover, extends long between the first frame and the second frame, and is coupled to the first frame and the second frame; and a mount which is positioned behind the module cover, adjacent to the one side of the module cover, and is coupled to the bar, wherein the mount is coupled to the first frame and the module cover.

According to another aspect of the present disclosure, the first frame may further include a coupling part which protrudes from an inside of the first frame toward the second frame and faces a rear surface of the module cover, wherein the coupling part may be coupled to the module cover and the mount between the module cover and the mount.

According to another aspect of the present disclosure, the module cover may further include a fixing part which protrudes toward the coupling part from the rear surface of the module cover and is coupled to the coupling part and the mount.

According to another aspect of the present disclosure, the module cover may further include a rigid part which is formed while being pressed toward the coupling part from a front surface of the module cover, the fixing part may be provided in a rear surface of the rigid part.

According to another aspect of the present disclosure, the fixing part may be a pemnut, the coupling part may further include a coupling hole which is formed to penetrate the coupling part and is arranged in the fixing part, and the mount may further include a mount hole which is formed to penetrate the mount and is arranged in the coupling hole.

According to another aspect of the present disclosure, the module cover may further include a bar fixing part that protrudes toward the bar from the rear surface of the rigid part and is fixed to the bar.

According to another aspect of the present disclosure, the bar fixing part may be a pemnut, and the bar may further include a bar rigid part which is formed while being pressed toward the bar fixing part from the rear surface of the bar, wherein the bar rigid part may further include a bar hole which is formed to penetrate the bar rigid part and arranged in the bar fixing part.

According to another aspect of the present disclosure, the coupling part may further include a seating portion which is formed while lowering from a rear surface of the coupling part to a front, and a part of the bar and a part of the mount may be in contact with a rear surface of the seating portion.

According to another aspect of the present disclosure, the mount may further include: a contact portion which contacts the rear surface of the seating portion, the contact portion including a front boss that protrudes from the contact portion toward the seating portion and inserted into the rear surface of the seating portion; a flat plate portion which is formed while being lowered toward a front with respect to the contact portion, and faces a rear surface of the module cover; and a step portion which is formed between the contact portion and the flat plate portion, the step portion being engaged with a lower end of the seating portion.

According to another aspect of the present disclosure, the bar may further include: a body which extends long in a vertical direction; and a protrusion which is adjacent to an upper end of the body, and protrudes to a front from the body, wherein the protrusion is engaged with a lower end of the seating portion.

According to another aspect of the present disclosure, the bar may further include: a first bar which is adjacent to a left side of the mount, and coupled to the seating portion and the mount; and a second bar which is adjacent to a right side of the mount, and coupled to the seating portion and the mount, wherein the first bar may include a first upper bending part that is bent toward a rear from the first bar, and is engaged with a left end of the seating portion, and the second bar may include a second upper bending part that is bent toward a rear from the second bar, and is engaged with a right end of the seating portion.

According to another aspect of the present disclosure, the first bar may further include: a first lower bending part which is spaced to a lower side from the first upper bending part, and is bent to a front from the first bar; and a bar rigid part which is formed while being pressed toward a front from a rear surface of the first bar, wherein at least a part of the bar rigid part may be disposed between a lower end of the first upper bending part and an upper end of the first lower bending part.

According to another aspect of the present disclosure, the mount may further include: a vertical rigid part which is formed while being pressed to a rear from a front surface of the mount, and extends in a length direction of the bar; and a rear boss which protrudes to a rear from a rear surface of the vertical rigid part, the bar may further include an insertion hole which is formed to penetrate the bar, and into which the rear boss is inserted.

According to another aspect of the present disclosure, the mount may further include: a horizontal rigid part which is formed while being pressed to a front from a rear surface of the mount, and extends in a direction intersecting a length direction of the bar; and a bracket which is coupled to the horizontal rigid part at a rear of the horizontal rigid part, wherein the bracket may include: a first plate which is coupled to the horizontal rigid part; a second plate opposite to the first plate; and a link which is pivotably connected to the first plate and the second plate between the first plate and the second plate.

According to another aspect of the present disclosure, the display device may further include: a cover which is located in a front of the display panel, and movably coupled to the frame; and a lift assembly which moves the cover in a direction in which the first frame and the second frame are spaced apart from each other, wherein the cover may open or close at least a portion of a front surface of the display panel.

The effect of the display device according to the present disclosure is as follows.

According to at least one of the embodiments of the present disclosure, provided is a cover structure that can cover or open the front surface of the display panel.

According to at least one of the embodiments of the present disclosure, provided is a display device that is installed on a wall through a tilting bracket.

According to at least one of the embodiments of the present disclosure, rigidity of a frame forming a skeleton of a display device may be improved.

According to at least one of the embodiments of the present disclosure, it is possible to minimize the deformation or damage of a frame due to the tilting of the display device using a bracket or the load of the display device.

Certain embodiments or other embodiments of the disclosure described above are not mutually exclusive or distinct from each other. Any or all elements of the embodiments of the disclosure described above may be combined or combined with each other in configuration or function.

For example, a configuration "A" described in one embodiment of the disclosure and the drawings and a configuration "B" described in another embodiment of the disclosure and the drawings may be combined with each other. Namely, although the combination between the configurations is not directly described, the combination is possible except in the case where it is described that the combination is impossible.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A display device comprising:
   a module cover;
   a display panel which is positioned in front of the module cover, and is coupled to the module cover;
   a frame which surrounds a side surface of the module cover, the frame including a first frame adjacent to one side of the module cover and a second frame adjacent to the other side of the module cover opposite to the one side of the module cover;
   a bar which is positioned behind the module cover, extends long between the first frame and the second frame, and is coupled to the first frame and the second frame; and
   a mount which is positioned behind the module cover, adjacent to the one side of the module cover, and is coupled to the bar,
   wherein the mount is coupled to the first frame and the module cover,
   wherein the first frame comprises a coupling part which protrudes from an inside of the first frame toward the second frame and faces a rear surface of the module cover, wherein the coupling part is disposed between the module cover and the mount, and is coupled to the module cover and the mount, wherein the module cover comprises:
- a fixing part which protrudes toward the coupling part from the rear surface of the module cover and is coupled to the coupling part and the mount;
- a rigid part which is formed while being pressed toward the coupling part from a front surface of the module cover, wherein the fixing part is provided in a rear surface of the rigid part; and
- a bar fixing part that protrudes toward the bar from the rear surface of the rigid part and is fixed to the bar.

2. The display device of claim 1, wherein the fixing part is a pemnut,
the coupling part further comprises a coupling hole which is formed to penetrate the coupling part and is arranged in the fixing part, and
the mount further comprises a mount hole which is formed to penetrate the mount and is arranged in the coupling hole.

3. The display device of claim 1, wherein the bar fixing part is a pemnut, and
the bar further comprises a bar rigid part which is formed while being pressed toward the bar fixing part from the rear surface of the bar,
wherein the bar rigid part further comprises a bar hole which is formed to penetrate the bar rigid part and arranged in the bar fixing part.

4. The display device of claim 1, wherein the coupling part further comprises a seating portion which is formed while lowering from a rear surface of the coupling part to a front, and
a part of the bar and a part of the mount are in contact with a rear surface of the seating portion.

5. The display device of claim 4, wherein the mount further comprises:
- a contact portion which contacts the rear surface of the seating portion, the contact portion comprising a front boss that protrudes from the contact portion toward the seating portion and inserted into the rear surface of the seating portion;
- a flat plate portion which is formed while being lowered toward a front with respect to the contact portion, and faces a rear surface of the module cover; and
- a step portion which is formed between the contact portion and the flat plate portion, the step portion being engaged with a lower end of the seating portion.

6. The display device of claim 4, wherein the bar comprises:
- a body which extends long in a vertical direction; and
- a protrusion which is adjacent to an upper end of the body, and protrudes to a front from the body,
wherein the protrusion is engaged with a lower end of the seating portion.

7. The display device of claim 4, wherein the bar further comprises:
- a first bar which is adjacent to a left side of the mount, and coupled to the seating portion and the mount; and
- a second bar which is adjacent to a right side of the mount, and coupled to the seating portion and the mount,
wherein the first bar comprises a first upper bending part that is bent toward a rear from the first bar, and is engaged with a left end of the seating portion, and
the second bar comprises a second upper bending part that is bent toward a rear from the second bar, and is engaged with a right end of the seating portion.

8. The display device of claim 7, wherein the first bar further comprises:
- a first lower bending part which is spaced to a lower side from the first upper bending part, and is bent to a front from the first bar; and
- a bar rigid part which is formed while being pressed toward a front from a rear surface of the first bar,
wherein at least a part of the bar rigid part is disposed between a lower end of the first upper bending part and an upper end of the first lower bending part.

9. The display device of claim 1, wherein the mount further comprises:
- a vertical rigid part which is formed while being pressed to a rear from a front surface of the mount, and extends in a length direction of the bar; and
- a rear boss which protrudes to a rear from a rear surface of the vertical rigid part,
wherein the bar further comprises an insertion hole which is formed to penetrate the bar, and into which the rear boss is inserted.

10. The display device of claim 1, wherein the mount further comprises:
- a horizontal rigid part which is formed while being pressed to a front from a rear surface of the mount, and extends in a direction intersecting a length direction of the bar; and
- a bracket which is coupled to the horizontal rigid part at a rear of the horizontal rigid part,
wherein the bracket comprises:
a first plate which is coupled to the horizontal rigid part;
a second plate opposite to the first plate; and
a link which is pivotably connected to the first plate and the second plate between the first plate and the second plate.

11. The display device of claim 1, further comprising:
a cover which is positioned in front of the display panel, and movably coupled to the frame; and
a lift assembly which moves the cover in a direction in which the first frame and the second frame are spaced apart from each other,
wherein the cover opens or closes at least a portion of a front surface of the display panel.

* * * * *